United States Patent
Jang et al.

(10) Patent No.: US 12,178,030 B2
(45) Date of Patent: Dec. 24, 2024

(54) DISPLAY DEVICE AND DISPLAY APPARATUS

(71) Applicant: LG DISPLAY CO., LTD., Seoul (KR)

(72) Inventors: Dongwon Jang, Goyang-si (KR); Kou Choi, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 232 days.

(21) Appl. No.: 17/897,649

(22) Filed: Aug. 29, 2022

(65) Prior Publication Data

US 2023/0062254 A1 Mar. 2, 2023

(30) Foreign Application Priority Data

Aug. 31, 2021 (KR) .................. 10-2021-0115245

(51) Int. Cl.
*H05K 9/00* (2006.01)
*H05K 5/03* (2006.01)
*H05K 7/20* (2006.01)

(52) U.S. Cl.
CPC ............ *H05K 9/0067* (2013.01); *H05K 5/03* (2013.01); *H05K 7/20963* (2013.01)

(58) Field of Classification Search
CPC .............. H10K 59/87; H10K 59/8794; H10K 59/8791; H10K 77/111; H05K 5/03; H05K 7/20963; H05K 9/0067; G02F 1/133331; G02F 2202/22; G06F 1/1637; H04M 1/0266
USPC ........................................................ 361/212
See application file for complete search history.

(56) References Cited

U.S. PATENT DOCUMENTS

| | | | |
|---|---|---|---|
| 10,496,134 B2 | 12/2019 | Park et al. | |
| 10,929,635 B2 | 2/2021 | Kwon et al. | |
| 11,157,044 B2 | 10/2021 | Park et al. | |
| 11,917,857 B2 | 2/2024 | Li et al. | |
| 11,983,039 B2 | 5/2024 | Park et al. | |
| 2023/0066009 A1* | 3/2023 | Wang ................... | G09G 3/3233 |

FOREIGN PATENT DOCUMENTS

| | | |
|---|---|---|
| CN | 103187010 A | 7/2013 |
| CN | 107871770 A | 4/2018 |
| CN | 109427853 A | 3/2019 |
| CN | 111725282 A | 9/2020 |
| CN | 112909069 A | 6/2021 |
| CN | 113179623 A | 7/2021 |
| KR | 10-1084858 B1 | 11/2011 |
| KR | 10-2021-0081953 A | 7/2021 |
| KR | 2021081953 A * | 7/2021 |

OTHER PUBLICATIONS

Machine translation of Choi et al. Korean Patent Document KR 20210081953 A Jul. 2021 (Year: 2021).*
Chinese Office Action dated Mar. 6, 2024 issued in Patent Application No. 202210700481.1w/English Translation (17 pages).

* cited by examiner

*Primary Examiner* — Kevin J Comber
(74) *Attorney, Agent, or Firm* — POLSINELLI PC

(57) ABSTRACT

A display device has an anti-static layer extending from a cover member along a side surface of a display panel to an inner surface of a hole of a cushion plate. Thus, a contact area between the anti-static layer and the display panel may be increased, thereby reducing a brighter phenomenon and a greenish phenomenon at a distal end of the display panel.

18 Claims, 19 Drawing Sheets

DISPLAY DEVICE AND DISPLAY APPARATUS

CROSS-REFERENCE TO RELATED APPLICATION

This application claims the priority of Korean Patent Application No. 10-2021-0115245 filed on Aug. 31, 2021, which is hereby incorporated by reference in its entirety.

FIELD OF THE DISCLOSURE

The present disclosure relates to a display device and a display apparatus, and more particularly, to provide a display device and a display apparatus capable of reducing occurrence of a brighter phenomenon and a greenish phenomenon at a distal end of a display panel.

DESCRIPTION OF BACKGROUND

Display apparatuses are implemented in a variety of forms, such as televisions, monitors, smart phones, tablet PCs, laptops, and wearable devices.

In general, a display apparatus includes a display area for displaying a screen and a non-display area formed along an outer edge of the display area.

In the display apparatus, the non-display area is also referred to as a bezel area. When the bezel area is thick, the user's gaze is dispersed. When the bezel area is thin, the user's gaze may be fixed on the screen of the display area and thus immersion may be increased.

In other words, when the bezel area becomes thinner, an overall size of the display apparatus may be reduced while increasing the user's immersion. Thus, demand from consumers for a display apparatus having the reduced bezel area as much as possible is increasing.

Electric charges may be generated on a surface of a display apparatus due to physical friction or the like.

When the electric charges generated in this way are not discharged to an outside through a ground path, the electric charges may be intensively accumulated on a side surface of a distal end of a display panel located in a bezel area of the display panel.

When the electric charges are accumulated in a specific area, an electric field may be generated in proportion to an amount of the accumulated electric charges.

Therefore, when the electric charges generated on the surface of the display apparatus are not effectively discharged to the outside, a strong electric field may be generated on the side surface of the distal end of the display panel.

When the strong electric field is generated on the side surface of the distal end of the display panel, a brighter phenomenon in which a side area of the distal end becomes brighter compared to a display area of the display panel and a greenish phenomenon in which a partial area becomes green may occur.

When the brighter phenomenon and the greenish phenomenon occur at the distal end of the display panel, this may lead to a quality defect of the display panel.

SUMMARY

Accordingly, the present disclosure is to provide a display device and a display apparatus that may reduce the occurrence of the brighter phenomenon and the greenish phenomenon at the distal end of the display panel.

More specifically, the present disclosure is to provide a display device and a display apparatus that can reduce accumulation of electric charges in a specific side area of a display panel.

The present disclosure is to provide a display device and a display apparatus capable of dispersing an electric field generating area in a side area of a display panel.

The present disclosure is also to provide a display device and a display apparatus that may allow easy management of a formation area and a thickness of an anti-static layer disposed in a display device.

The present disclosure is also to provide a display device and a display apparatus that may effectively protect a distal end area of a display panel vulnerable to cracks.

The present disclosure is not limited to the above-mentioned features. Other advantages of the present disclosure that are not mentioned may be understood based on following descriptions, and may be more clearly understood based on the present disclosure. Further, it will be easily understood that advantages of the present disclosure may be realized using means shown in the claims and combinations thereof.

A display device according to an aspect of the present disclosure includes a cover member; a display panel disposed on a back surface of the cover member; a cushion plate disposed on a back surface of the display panel, wherein the cushion plate has at least one hole defined in an edge portion thereof; and an anti-static layer formed to electrically connect the cover member and the cushion plate to each other.

A display device according to another aspect of the present disclosure includes a cover member; a display panel disposed on a back surface of the cover member; a cushion plate disposed on a back surface of the display panel, wherein the cushion plate has at least one hole defined therein; and an anti-static layer extending from the cover member along a side surface of the display panel to an inner surface of the hole of the cushion plate.

A display apparatus according to an aspect of the present disclosure includes the display device as defined above, and a casing disposed on a back surface of the display device so as to support the cover member.

According to an aspect of the present disclosure, the anti-static layer extending from the cover member along the side surface of the display panel to the inner surface of the hole of the cushion plate may be formed, such that a contact area between the anti-static layer and the display panel may be increased.

Accordingly, the accumulation of the electric charges in the specific area of the side surface of the display panel may be reduced, thereby reducing the concentration of the electric charges into the specific area.

Further, as the concentration of the electric charges on the specific area of the side surface of the display panel is reduced, an electric field generation area may be dispersed, thereby reducing the brighter phenomenon and the greenish phenomenon that may otherwise occur intensively in the partial area of the side surface of the display panel.

Further, the hole of the cushion plate may act as a boundary where the anti-static layer is terminated. The anti-static layer may be formed on the inner surface of the hole. Thus, the formation area and the thickness of the anti-static layer may be easily controlled as required by the user.

Accordingly, when assembling additional components such as a frame with the display device, high-frequency noise (RF noise) that may occur when the anti-static layer having a larger length or a larger thickness than a design requirement is formed may be lowered.

Further, a metal layer may constitute the outermost portion of the cushion plate, thereby effectively protecting the distal end area of the display panel which is vulnerable to cracks.

Effects of the present disclosure are not limited to the above-mentioned effects, and other effects as not mentioned will be clearly understood by those skilled in the art from following descriptions.

BRIEF DESCRIPTION OF DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

DETAILED DESCRIPTIONS

Figure 1A:
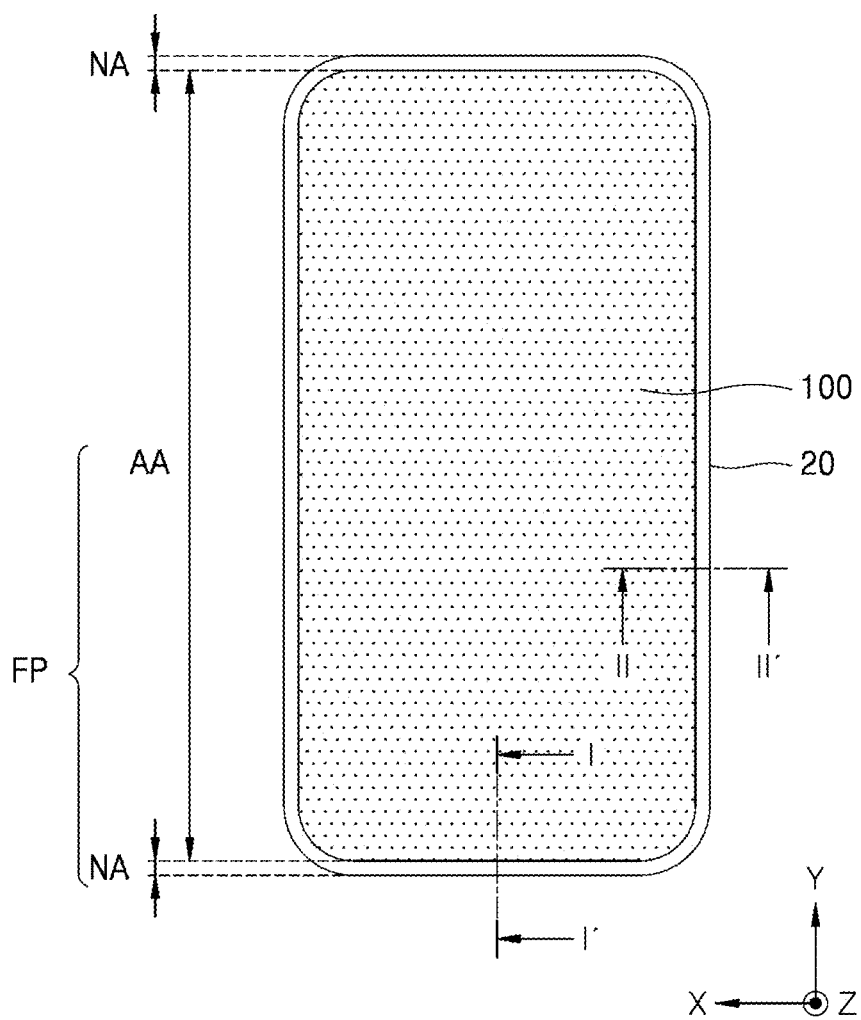
FIG. 1A and FIG. 1C respectively show a front surface and a back surface of a display apparatus according to an aspect of the present disclosure.

Advantages and features of the present disclosure, and a method of achieving the advantages and features will become apparent with reference to aspects described later in detail together with the accompanying drawings. However, the present disclosure is not limited to the aspects as disclosed below, but may be implemented in various different forms. Thus, these aspects are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular aspects only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of at least one of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various aspects of the present disclosure may be partially or entirely combined with each other, and may be technically associated with each other or operate with each other. The aspects may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various aspects of the present disclosure may be partially or entirely combined with each other, and may be technically associated with each other or operate with each other. The aspects may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The display apparatus according to the present disclosure may be applied to an organic light-emitting display apparatus. The disclosure is not limited thereto. The display apparatus according to the present disclosure may be applied to various display apparatuses such as a micro LED display apparatus or a quantum dot display apparatus.

Hereinafter, a display apparatus according to an aspect of the present disclosure will be described in detail with reference to the drawings.

Figure 1B:
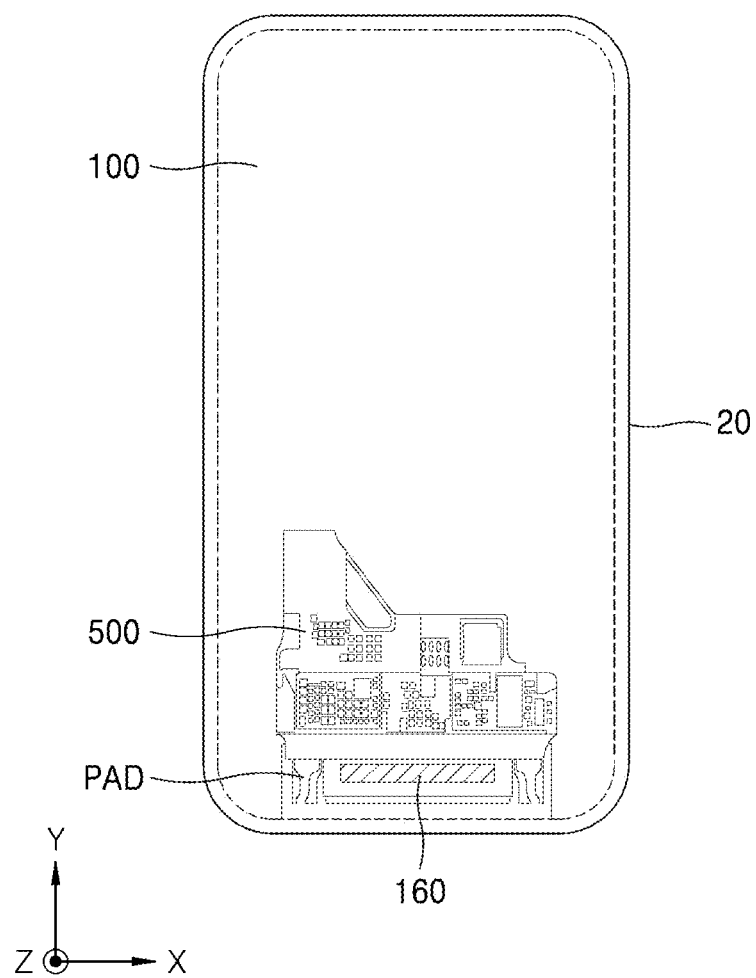
FIG. 1B shows a back surface of a display device in a state in which a casing is removed.
Figure 1C:
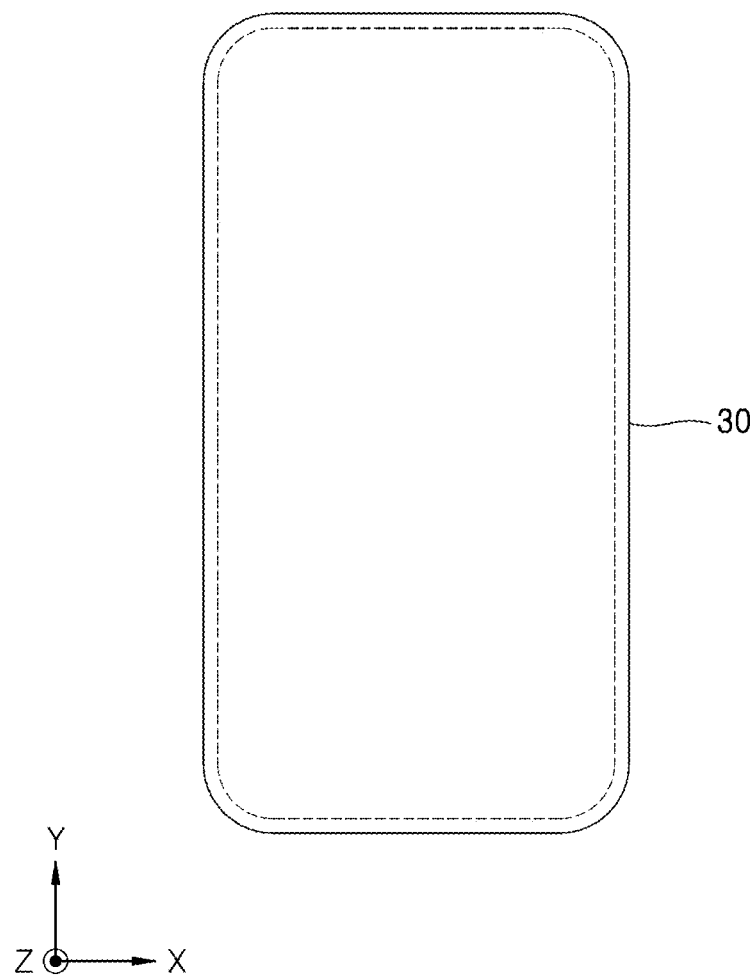

FIG. 1A and FIG. 1C respectively show front and back surfaces of the display apparatus according to an aspect of the present disclosure, and FIG. 1B shows the back surface of the display apparatus in a state in which a casing is removed.

As used herein, each of frontward and upward directions may mean a Z-axis direction, and each of backward and downward directions may mean a −Z-axis direction.

A display apparatus 1 may include a display device 10 including a cover member 20 and a display panel 100 attached to a bottom of the cover member 20. A direction from a top to the bottom of the cover member may refer to the downward direction (−Z axis direction).

The cover member 20 may be disposed to constitute the front portion of the display apparatus 1 to protect the display apparatus 1 from external impact.

An edge portion of the cover member 20 may have a curved portion or a bent portion that is curved or bent toward the back surface of the display device 10.

Since the cover member 20 may be disposed to cover a side surface of the display device 10 of the display apparatus 1, the cover member 20 may protect the display panel 100 from external impact not only on the front surface of the display device 10 but also on a side surface thereof.

The cover member 20 may vertically overlap the display area AA of the display panel that displays an image. For example, the cover member 20 may be made of a transparent plastic material that may transmit an image therethrough, or may be made of a cover glass of a transparent glass material. The present disclosure is not limited thereto.

A casing 30 for supporting the cover member 20 may be disposed on the back surface of the display device 10.

The casing 30 may serve as a housing that protects the rear surface of the display apparatus 1, and may function as a casing constituting the outermost shell of the display apparatus 1.

The casing 30 may be made of various materials such as plastic, metal, or glass.

A middle frame (not shown) may be additionally disposed between the cover member 20 and the casing 30.

The middle frame may be disposed on a back surface of the display device 10 and may accommodate therein the display device 10. The middle frame may contact the cover member 20 such that the middle frame supports the cover member 20.

The middle frame may serve as a housing that protects the rear surface of the display device 10.

The middle frame may have a structure in which the display device 10 is disposed on one surface of the middle frame 10, and additional components such as a battery to apply power to the display apparatus 1 is disposed on the other surface of the middle frame.

A front portion FP of the display panel 100 may be disposed on a bottom surface of the cover member 20.

The front portion FP may include a pixel array including a plurality of pixels having a plurality of light-emitting elements, and driving transistors, and signal lines transmitting a drive signal to the pixels, so that an image may be displayed from the front portion.

The front portion FP may include a display area AA (active area) where the image is displayed and a non-display area NA (non-active area) other than the display area AA. The non-display area NA may be formed as an edge area surrounding the display area AA.

The display area AA and the non-display area NA may be equally applied to the cover member 20.

An area of the cover member 20 through which the image transmits may be the display area AA thereof.

An area of the cover member 20 which surrounds the display area AA and through which the image does not transmit may be a non-display area NA thereof.

The non-display area NA may be defined as a bezel area.

The display panel 100 disposed under the cover member 20 may include a bent portion which extends from one side of the front portion FP thereof and is bent downwardly.

The bent portion may be located at the outermost part of the display panel 100, and thus may be easily exposed to external impact. The bent portion may be easily deformed or broken when the impact is applied thereto. Accordingly, a support member or a reinforcing member for protecting the bent portion may be added to absorb the impact.

Hereinafter, a structure of the display device 10 according to an aspect of the present disclosure will be described.

Figure 2:
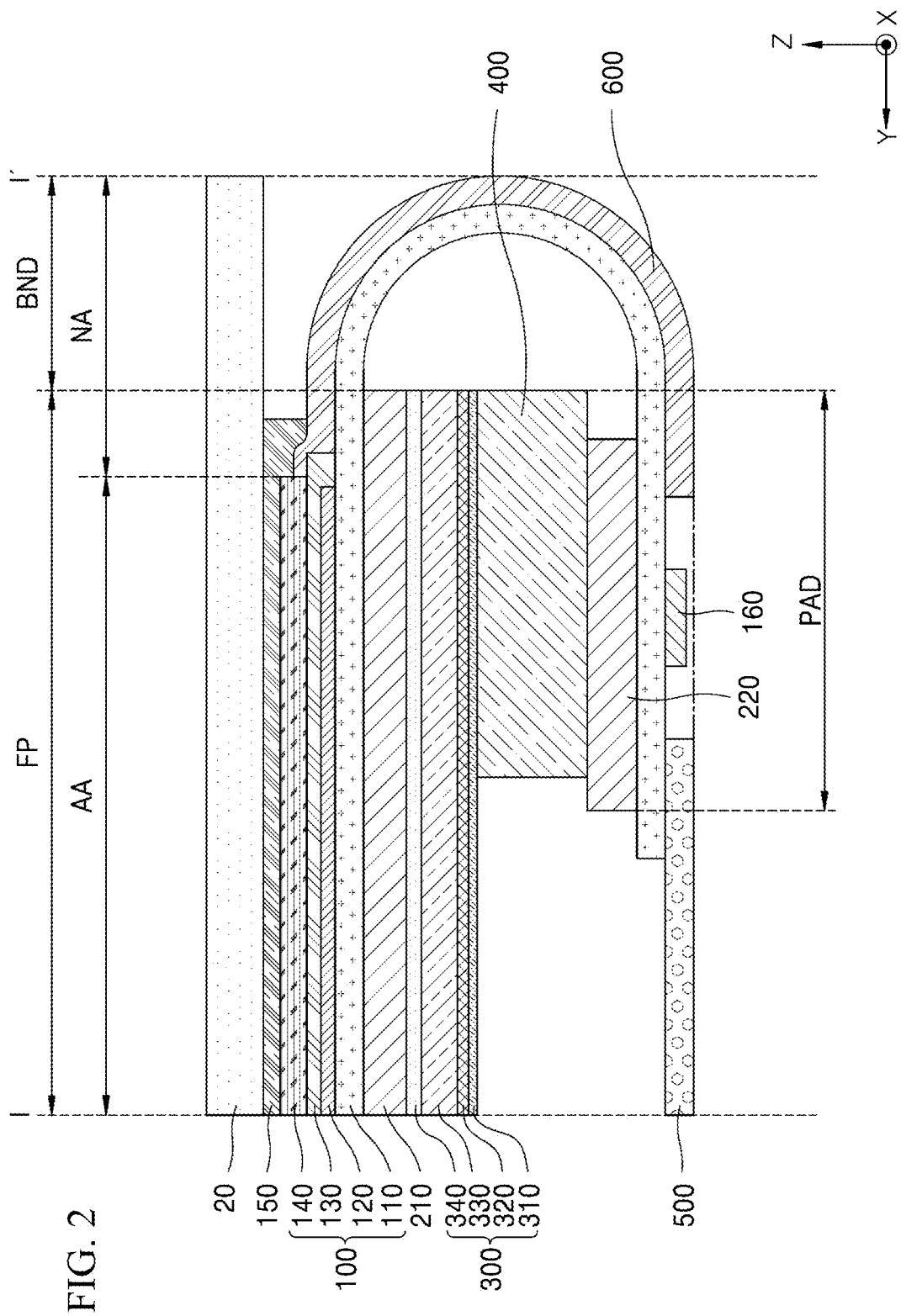
FIG. 2 is a cross-sectional view in I-I' direction of the display device according to an aspect of the present disclosure.

FIG. 2 is a cross-sectional view taken along a I-I' direction in FIG. 1A, which illustrates the display device 10 according to an aspect of the present disclosure.

The display device 10 may include the cover member 20 as the topmost portion thereof and the display panel 100 disposed under the cover member 20.

The display device 10 may include the display panel 100 having the front portion FP, a bent portion BND, and a pad portion PAD bent from the bent portion BND so as to be disposed on a back surface of the front portion FP, a cushion plate 300 disposed between the front portion FP and the pad portion PAD, and disposed below the front portion FP, and a second connection member 400 to fix the pad portion PAD to the cushion plate 300.

A first back plate 210, the cushion plate 300, the second connection member 400, a second back plate 220, and the pad portion PAD may be sequentially disposed under the front portion FP of the display panel 100.

A first connection member 150 may be disposed between the cover member 20 and the display panel 100.

The first connection member 150 may connect or combine the cover member 20 and the display panel 100 to each other.

For example, the first connection member 150 may be a fixing member. The present disclosure is not limited to the term.

Since the first connection member 150 may be disposed to vertically overlap with the display area AA, the first connection member 150 may be made of a material through which the image of the display panel 100 may transmit.

For example, the first connection member 150 may be made of or may include a material such as OCA (Optical Clear Adhesive), OCR (Optical Clear Resin), or PSA (Pressure Sensitive Adhesive). However, the present disclosure is not limited thereto.

The display panel 100 disposed under the cover member 20 may include the front portion FP, the bent portion BND, and the pad portion PAD which constitute a display substrate 110.

The front portion FP of the display panel 100 may be disposed under the first connection member 150. For example, the front portion FP may be a portion where the image is displayed. The front portion may include the display substrate 110, a pixel array 120, an encapsulation portion 130, and a polarizing plate 140.

The bent portion BND of the display panel 100 may extend from one side of the front portion FP and be bent downwardly (in the −Z-axis direction) and then horizontally (in a Y-axis direction). The bent portion BND may include the display substrate 110 and the signal line.

The pad portion PAD of the display panel 100 may extend from the bent portion BND and be disposed under the front portion FP.

The pad portion PAD may include the display substrate 110, the signal line, and a pad electrode connected to the signal line. A driver circuit 160 or a flexible circuit board 500 for driving a pixel may be mounted on the pad electrode.

The polarizing plate 140 may be disposed on the top surface of the front portion FP and thus may be disposed on the top surface of the display panel 100. In addition, a functional layer for improving display performance of the display apparatus may be further disposed between the first connection member 150 and the polarizing plate 140.

The polarizing plate 140 prevents reflection of external light and improves the outdoor visibility and contrast ratio of the image displayed on the display panel 100.

The display panel 100 may include the display substrate 110, the pixel array 120 disposed on the display substrate 110, and the encapsulation portion 130 disposed to cover the pixel array 120.

A portion of the display substrate 110 may constitute a bottom of the display panel 100.

The display substrate 110 may constitute each of the front portion FP, the bent portion BND, and the pad portion PAD.

The display substrate 110 may be made of a flexible plastic material and may have flexible properties.

The display substrate 110 may include polyimide, or may be made of a thin glass material having flexibility.

The pixel array 120 may be disposed on the display substrate 110. The pixel array 120 may display an image. An area where the pixel array 120 may be disposed may be the display area AA.

Accordingly, an area of the cover member 20 corresponding to the pixel array 120 may be a display area AA of the cover member 20, while an area of the cover member 20 other than the display area AA may be a non-display area NA of the cover member 20.

The pixel array 120 may include light-emitting elements, thin-film transistors for driving the light-emitting elements, and the signal lines such as a gate line, a data line, and a pixel driving power line on the display substrate 110.

The pixel array 120 may include pixels that display images based on signals supplied to the signal lines. The pixel may include the light-emitting element and the thin-film transistor.

The light-emitting element may include an anode electrode electrically connected to the thin-film transistor, a light-emitting layer formed on the anode electrode, and a cathode electrode for supplying a common voltage.

The thin-film transistor may include a gate electrode, a semiconductor layer, a source electrode, and a drain electrode. The semiconductor layer of the thin-film transistor may include silicon such as a-Si, poly-Si, or low-temperature poly-Si, or oxide such as IGZO (Indium-Gallium-Zinc-Oxide). The present disclosure is not limited thereto.

The anode electrode may be disposed in each pixel area and in a corresponding manner to an opening area defined according to a pattern shape of the pixel and may be electrically connected to the thin-film transistor.

The light-emitting element may include a light-emitting layer formed between the anode electrode and the cathode electrode. The light-emitting element may be implemented to emit light of the same color such as white light for each pixel or to emit light of a different color such as red, green, or blue for each pixel.

The encapsulation portion 130 may be disposed on the display substrate 110 so as to cover the pixel array 120.

The encapsulation portion 130 may prevent oxygen, moisture, or foreign material from invading the light-emitting layer of the pixel array 120. For example, the encapsulation portion 130 may be formed in a multi-layer structure in which an organic material layer and an inorganic material layer are alternately stacked. The present disclosure is not limited thereto.

The front portion FP of the display panel 100 may include the display substrate 110, the pixel array 120, and the encapsulation portion 130. The front portion may be formed in a flat manner except for an edge portion thereof.

The first back plate 210 to be described later may be connected or coupled to the back surface of the front portion FP so as to maintain the flat state of the front portion FP.

The bent portion BND of the display panel 100 may be free of the pixel array 120, the encapsulation portion 130, and the first back plate 210 to be described later, and may include the display substrate 110. The bent portion BND may be a portion that may be easily bent in a direction desired by the user.

The pad portion PAD of the display panel 100 may be free of the pixel array 120 and the encapsulation portion 130.

The second back plate 220 may be connected or coupled to a back surface of the pad portion PAD so that the pad portion PAD may be maintained in the flat state.

Therefore, the front portion FP of the display panel 100 may be disposed in the area in which the screen is displayed, and the pad portion PAD may be bent from the bent portion BND horizontally and inwardly and may be disposed below the front portion FP, that is, on the back surface of the front portion FP.

The first back plate 210 disposed under the front portion FP of the display panel 100 and the second back plate 220 disposed under the pad portion PAD may be disposed under the display substrate 110 so as to complement rigidity of the display substrate 110, and to maintain the front surface FP in the flat state.

Each of the first back plate 210 and the second back plate 220 may be formed to have a certain strength and thickness to complement the rigidity of the display substrate 110, and may not be formed in a bent portion area where the bent portion BND is located.

Based on a shape before the display panel 100 is bent, the first back plate 210 and the second back plate 220 may be disposed under the display substrate 110 and spaced apart from each other.

Based on a shape after the display panel 100 is bent, the first back plate 210 may be disposed under the front portion FP, and the second back plate 220 may be disposed on a top surface of the pad portion PAD.

Each of the first back plate 210 and the second back plate 220 may be a back plate disposed on the back surface of the display substrate 110.

Each of the first back plate 210 and the second back plate 220 may be composed of a plastic thin-film with rigidity.

For example, each of the first back plate 210 and the second back plate 220 may be made of polyethylene terephthalate (PET), polyimide (PI), polyethylene naphthalate (PEN), etc. The present disclosure is not limited thereto.

The first back plate 210 and the second back plate 220 may be made of the same material and may have the same thickness. The present disclosure is not limited thereto.

Based on the shape after the display panel 100 is bent, the cushion plate 300 may be disposed between the first back plate 210 and the second back plate 220.

The cushion plate 300 may be disposed under the first back plate 210.

The cushion plate 300 may include at least one of a heat-dissipation layer 310, a lift-off prevention layer 320, a cushion layer 330, and an adhesive layer 340. For example, the cushion plate 300 may have a structure in which the adhesive layer 340, the cushion layer 330, the lift-off prevention layer 320, and the heat-dissipation layer 310 are stacked downwardly sequentially.

The heat-dissipation layer 310 may be disposed in a corresponding manner to a component that generates a high temperature and may include a material with high thermal conductivity. Accordingly, a heat-dissipation effect of the display panel 100 may be improved.

The heat-dissipation layer 310 may be a conductive layer having conductivity. Accordingly, the heat-dissipation layer 310 may have a grounding function and a function of protecting the back surface of the display substrate 110 together with the heat-dissipation function.

When the heat-dissipation layer 310 is made of a metal layer, the layer 310 may effectively protect a distal end area of the display panel 100, which is vulnerable to cracks.

For example, the heat-dissipation layer 310 may include a metal having high thermal conductivity such as copper (Cu) and aluminum (Al), or graphite, or the like. The present disclosure is not limited thereto.

Further, the heat-dissipation layer 310 may include SUS (Stainless Use Steel), and may be embodied as a SUS plate.

When the heat-dissipation layer 310 includes the SUS, the heat-dissipation layer 310 may have higher thermal conductivity and strength while having a smaller thickness, compared to a case in which the heat-dissipation layer 310 includes other metals.

The lift-off prevention layer 320 may be disposed on the heat-dissipation layer 310.

The lift-off prevention layer 320 may be made of a flexible material such as polyimide. The present disclosure is not limited thereto.

When a side surface of the cover member 20 is bent, the cushion plate 300 may have a lifting phenomenon. For this reason, the lift-off prevention layer 320 may be disposed to prevent the lifting phenomenon.

Since the lift-off prevention layer 320 has flexibility, the layer 320 may minimize the lifting phenomenon that may otherwise occur when the cover member 20 is curved.

The cushion layer 330 may be disposed on the lift-off prevention layer 320, and may include a foam tape or a foam pad.

The cushion layer 330 may reduce the impact to various parts that may come into contact with the cushion plate 300.

The cushion layer 330 with an impact reducing function may reinforce the rigidity of the cushion plate 300.

The adhesive layer 340 may be disposed on the cushion layer 330, and may include an unevenness structure formed on a surface of the adhesive layer 340.

The unevenness structure of the adhesive layer 340 may prevent air bubbles from being generated between the first back plate 210 and the cushion plate 300 when the cushion plate 300 is attached to the first back plate 210. Thus, a degassing or defoaming process for removing air bubbles between the first back plate 210 and the cushion plate 300 may be omitted.

The adhesive layer 340 includes an adhesive component, and is in direct contact with the first back plate 210 to fix the cushion plate 300 to the first back plate 210.

The adhesive layer 340 may be made of or include a material such as at least one of OCA (Optical Clear Adhesive), OCR (Optical Clear Resin), or PSA (Pressure Sensitive Adhesive).

The second connection member 400 and the second back plate 220 may be disposed under the cushion plate 300.

The second connection member 400 may be disposed between the cushion plate 300 and the pad portion PAD.

When the pad portion PAD of the display panel 100 is bent from the bent portion BND so as to be disposed under the front portion FP of the display panel 100, a restoring force to restore the display panel 100 to a state before being bent may be strong.

When the restoring force is strongly applied, a lifting phenomenon in which the bent pad portion PAD of the display panel 100 is not fixed and is lifted off may occur.

The second connection member 400 may function as a fixing member that fixes the bent display panel 100 so that the display panel may maintain its bent shape.

The second connection member 400 may be formed to have a constant thickness in a thickness direction so as to maintain a constant curvature of the bent portion BND.

The second connection member 400 may be embodied as a double-sided tape having adhesive strength by which the second connection member 400 may fix the second back plate 220 and the heat-dissipation layer 310 to each other. The present disclosure is not limited thereto.

Alternatively, the second connection member 400 may be made of a foam tape or a foam pad having an adhesive force so as to further have an effect of mitigating the impact.

The second back plate 220 may be disposed under the second connection member 400.

To place the second back plate 220, the second back plate 220 may be attached to the bottom surface of the pad portion PAD, and then the bent portion BND may be bent, and the second back plate 220 may be attached and fixed to the bottom surface of the second connection member 400.

In a state in which the second back plate 220 is fixed to the second connection member 400, the second back plate 220 may be disposed on a top surface of the pad portion PAD.

For example, the second connection member 400 and the second back plate 220 may be disposed between the heat-dissipation layer 310 of the cushion plate 300 and the pad portion PAD.

While the second back plate 220 is fixed to the second connection member 400, an outer portion as a top surface of the bent portion BND may be exposed to the outside, while a bottom surface as an inner portion of the bent portion BND may surface toward the side surfaces of the cushion plate 300 and the second connection member 400.

A reinforcing member 600 may be disposed on a top surface of the bent portion BND of the display panel 100.

The reinforcing member 600 may extend so as to cover the bent portion BND, and to cover at least a partial area of each of the front portion FP and the pad portion PAD.

The reinforcing member 600 may include resin. For example, the reinforcing member 600 may include UV-curable acrylic resin. The present disclosure is not limited thereto.

Since the reinforcing member 600 may cover various signal lines disposed between the encapsulation portion 130 and the pad portion PAD of the display panel 100, the member 600 may prevent moisture from invading into the signal lines while protecting the signal line from the external impact.

In order to increase the flexibility of the display panel 100, the bent portion BND may be free of other components except for the display substrate 110 and the signal lines. Thus, the reinforcing member 600 may supplement the rigidity of the bent portion BND in which the other components are absent.

In one example, the driver circuit 160 may be disposed on the other surface to one surface of the pad portion PAD of the display panel 100 on which the second back plate 220 may be disposed.

The driver circuit 160 may be disposed in a form of a chip on plastic (COP) mounted on the display substrate 110. However, the present disclosure is not limited thereto.

The driver circuit 160 may generate a data signal and a gate control signal based on image data and a timing synchronization signal supplied from an external host driving system.

The driver circuit 160 may supply a data signal to the data line of each pixel via a display pad, and may supply a gate control signal to a gate driver circuit via the display pad.

The driver circuit 160 may be mounted in a chip mounting area defined in the display substrate 110, and may be electrically connected to the display pad, and may be connected to the signal lines of the gate driver circuit and the pixel array 120 disposed on the display substrate 110.

The display pad may be disposed at a distal end of the display substrate 110 on which the driver circuit 160 is mounted.

The display pad may be disposed on one surface of the display substrate 110 and electrically connected to the flexible circuit board 500 on which a circuit board is mounted.

The flexible circuit board 500 may be electrically connected to the display pad disposed on the distal end of the display substrate 110 via a film attachment process using a conductive adhesive layer, and may be positioned on the back surface of the display panel 100.

One example of a material of the conductive adhesive layer may include an anisotropic conductive film (ACF).

The circuit board may provide the image data and the timing synchronization signal supplied from the host driving system to the driver circuit 160, and may provide a voltage required to drive each of the pixel array 120 and the gate driver circuit and the driver circuit 160.

Figure 3A:
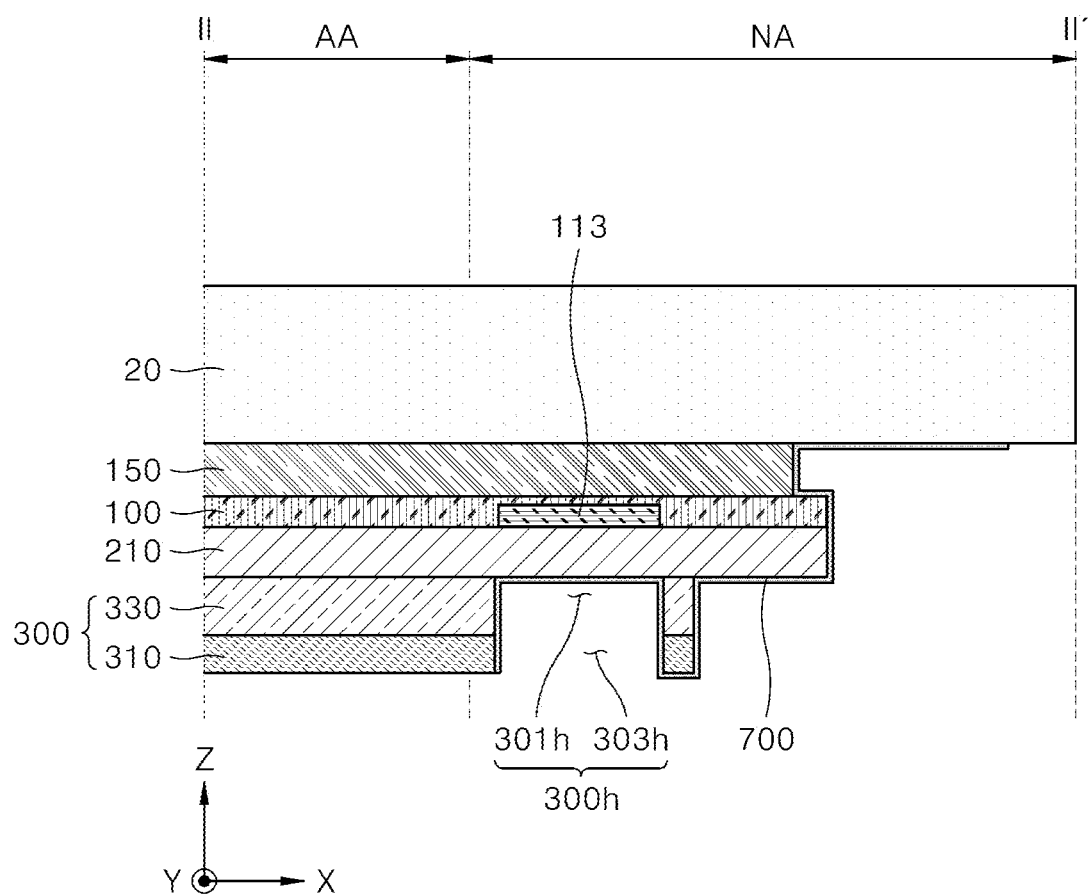
FIG. 3A to FIG. 3C are cross-sectional views in II-II' direction of display devices according to various aspects of the present disclosure, respectively.
Figure 3B:
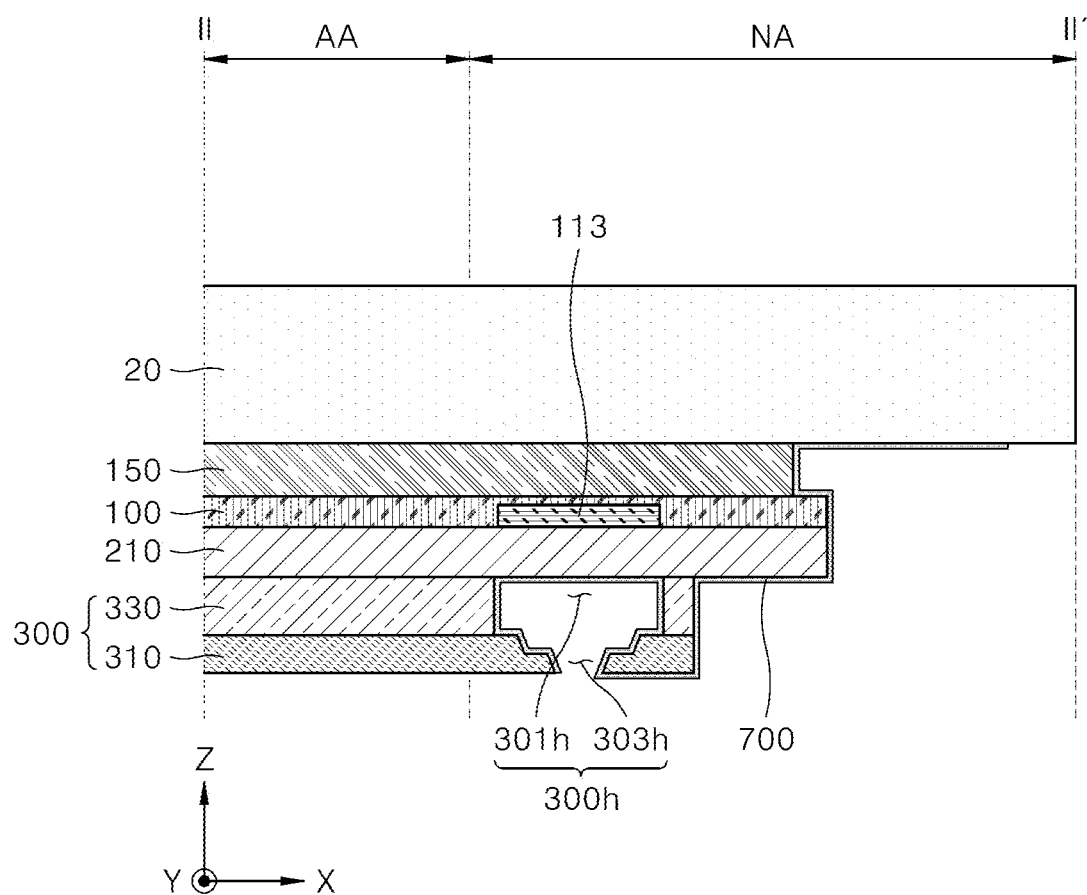
Figure 3C:
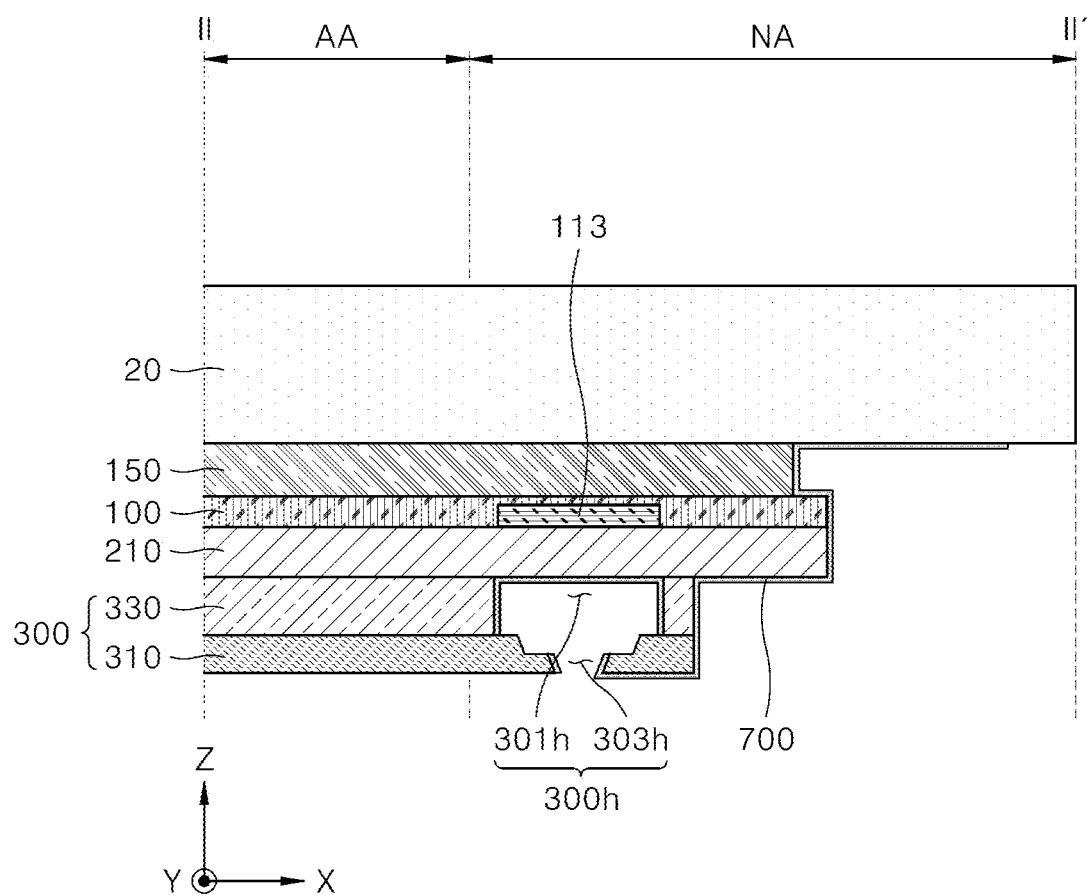

FIG. 3A to FIG. 3C are cross-sectional views taken along a II-II' direction in FIG. 1A respectively, which illustrate display devices according to various aspects of the present disclosure.

Each of the layers constituting the display device shown in each of FIG. 3A to FIG. 3C may be shown to have a different thickness or size from that of each of the layers constituting the display device shown in FIG. 2 for convenience of illustration. Descriptions of some of the layers may be omitted.

The display device 10 according to an aspect of the present disclosure may include the cover member 20, the display panel 100 disposed on a back surface of the cover member 20, and a cushion plate 300 disposed on a back surface of the display panel 100.

The cushion plate 300 may include one or more holes 300h located in an edge portion of the cushion plate 300.

The edge portion of the cushion plate 300 may refer to an area corresponding to the non-display area AA of the display panel 100.

Therefore, the hole 300h of the cushion plate 300 may be disposed to vertically overlap the non-display area AA.

Further, when the display panel 100 includes a GIP (Gate in Panel) driver in the non-display area AA, the hole 300h located on the back surface of the display panel 100 may be disposed to vertically overlap the GIP driver.

The hole 300h may be formed to extend through the cushion plate 300 in a vertical direction toward the display panel 100.

The cushion plate 300 may include at least one of the heat-dissipation layer 310, the lift-off prevention layer 320, the cushion layer 330, and the adhesive layer 340.

The hole 300h may be formed to extend through all layers included in the cushion plate 300.

For example, when the cushion plate 300 includes the heat-dissipation layer 310 and the cushion layer 330, the hole 300h may be formed to extend through the heat-dissipation layer 310 and the cushion layer 330. Alternatively, when the cushion plate 300 includes the heat-dissipation layer 310, the cushion layer 330, and the adhesive layer 340, the hole 300h may be formed to extend through the heat-dissipation layer 310, the cushion layer 330, and the adhesive layer 340.

Further, the hole 300h may be formed to extend through only at least one of the layers included in the cushion plate 300.

For example, when the cushion plate 300 includes the heat-dissipation layer 310 and the cushion layer 330, the hole 300h may be formed to extend through only the heat-dissipation layer 310. Alternatively, when the cushion plate 300 includes the heat-dissipation layer 310, the cushion layer 330, and the adhesive layer 340, the hole 300h may be formed to extend through only the heat-dissipation layer 310 and the cushion layer 330.

The hole 300h defined in the cushion plate 300 may include a blocked upper portion 301h and an open lower portion 303h vertically opposite the blocked upper portion 301h.

The open lower portion 303h of the hole 300h may refer to an open area of the hole 300h. The blocked upper portion 301h may refer to a remaining area of the hole 300h except for the open lower portion 303h.

A boundary between the blocked upper portion 301h and the open lower portion 303h of the hole 300h may be defined based on the layers included in the cushion plate 300.

For example, when the cushion plate 300 includes the heat-dissipation layer 310 and the cushion layer 330, a portion of hole 300h corresponding to the heat-dissipation layer 310 may correspond to the open lower portion 303h, while a portion of the hole 300h corresponding to the cushion layer 330 may correspond to the blocked upper portion 301h.

Further, when cushion plate 300 includes the heat-dissipation layer 310, the cushion layer 330, and the adhesive layer 340, a portion of the hole 300h corresponding to the heat-dissipation layer 310 may be the open lower portion 303h, and the remaining portion except for the open lower portion 303h of the hole 300h corresponding to a combination of the cushion layer 330 and the adhesive layer 340 may be the blocked upper portion 301h.

In one example, referring to FIG. 3A, a diameter of the open lower portion 303h of the hole 300h may be the same as a diameter of the blocked upper portion 301h.

Referring to FIG. 3B and FIG. 3C as another example, the diameter of the open lower portion 303h of the hole 300h may be smaller than the diameter of the blocked upper portion 301h.

For example, as the hole 300h extends in a direction from the blocked upper portion 301h to the open lower portion 303h, the diameter of the open lower portion 303h may decrease. The diameter of the open lower portion 303h may increase as the hole 300h extends in a direction from the open lower portion 303h to the blocked upper portion 301h.

In this case, the open lower portion 303h of the hole 300h may be stepped such that the diameter thereof increases as the hole 300h extends in a direction from the open lower portion 303h to the blocked upper portion 301h.

The hole 300h may be disposed along at least one side edge of the cushion plate 300.

Figure 4A:
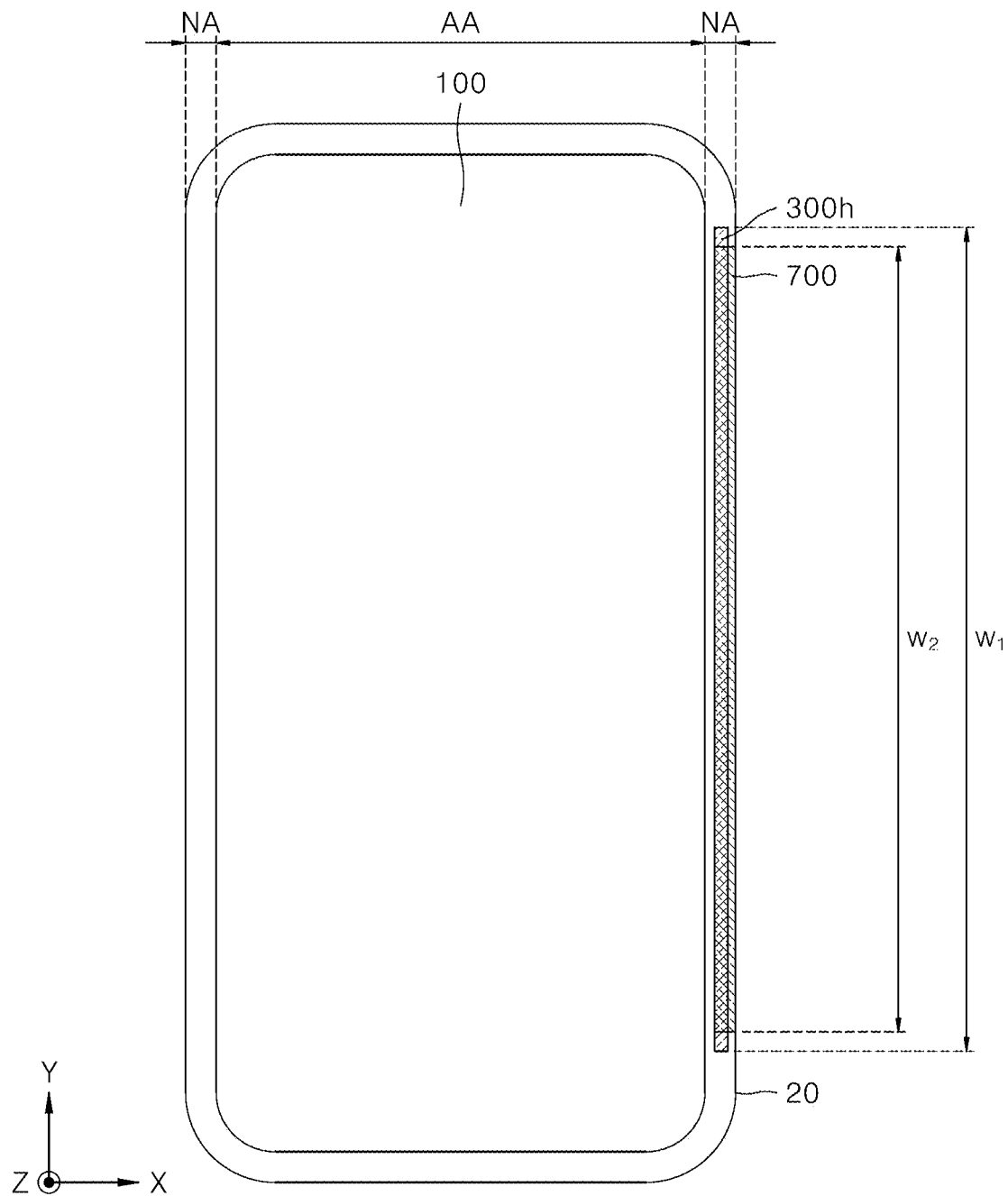
FIG. 4A and FIG. 4B are plan views of back surfaces of display devices according to various aspects of the present disclosure, respectively.

In one example, referring to FIG. 4A, the hole 300h may be formed in a shape of a line extending in an elongate manner along one side edge of the cushion plate 300.

Figure 4B:
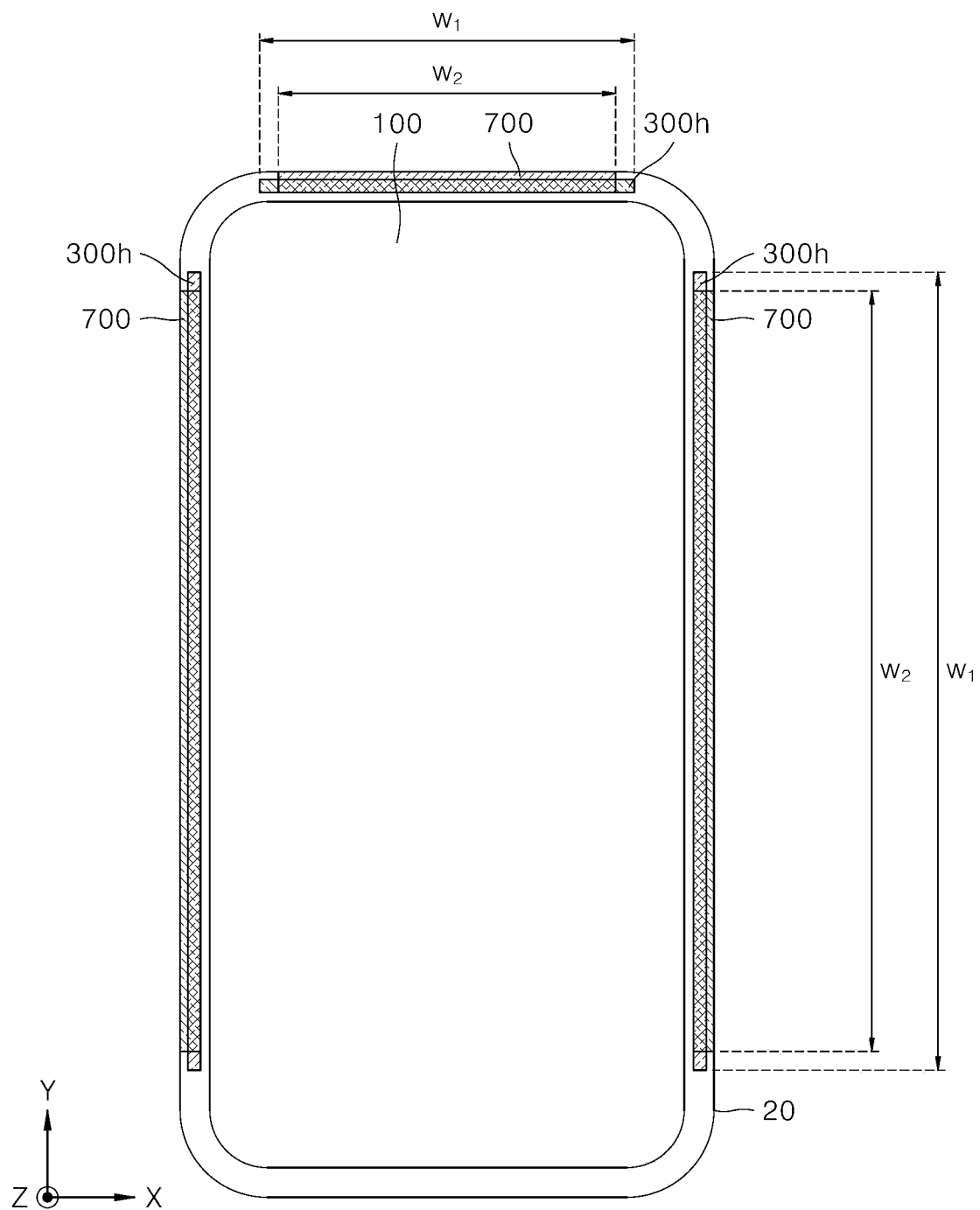

Further, referring to FIG. 4B, the hole 300h may be formed in a shape of a line extending along each of at least one side edge of the cushion plate 300, for example, three side edges thereof except for one side edge at which the flexible circuit board 500 is disposed.

In this case, the line-shaped hole 300h extending in an elongate manner along each of the three side edges of the cushion plate 300 may discontinuously or continuously extend.

Figure 5A:
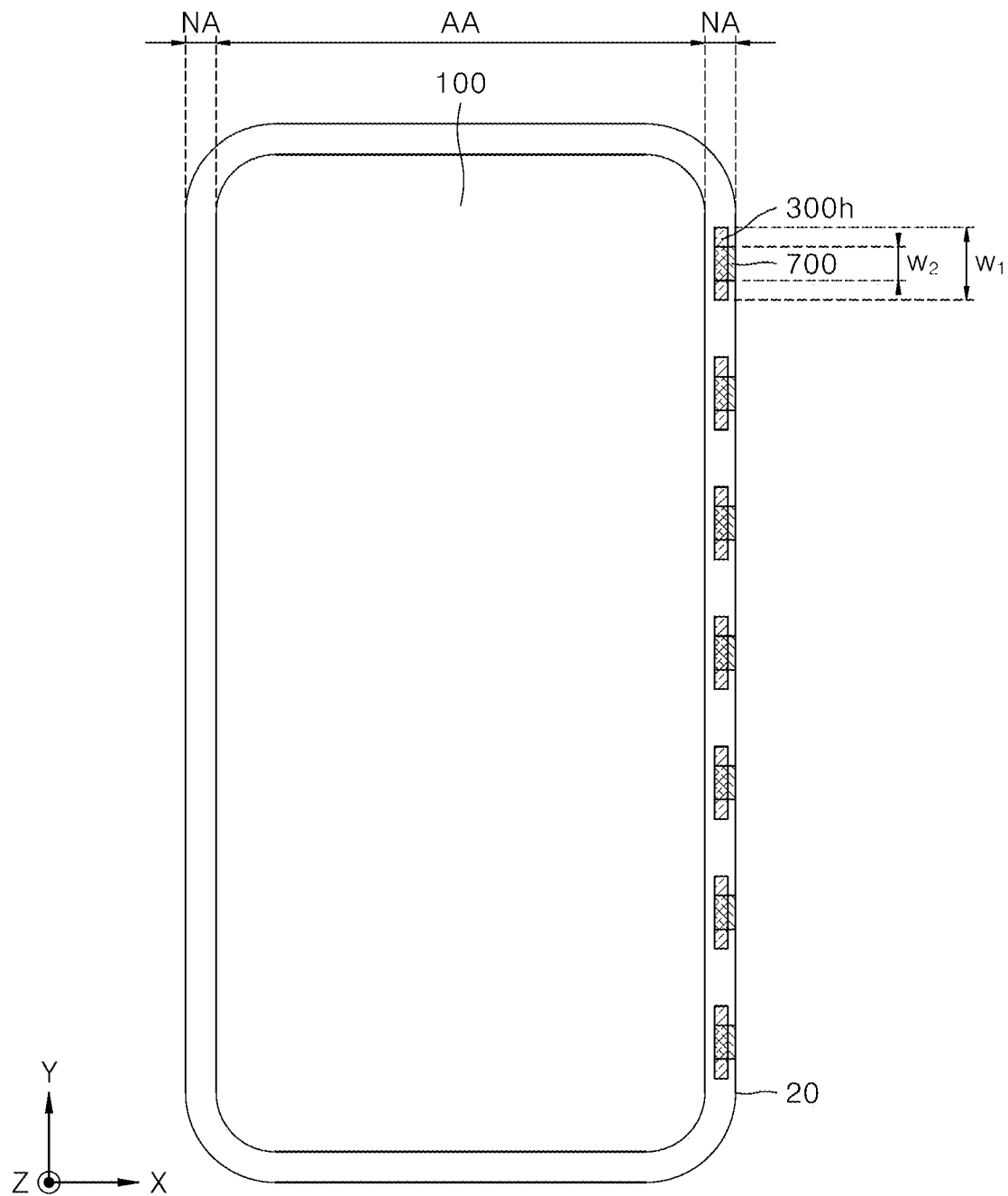
FIG. 5A and FIG. 5B are plan views of back surfaces of display devices according to various aspects of the present disclosure, respectively.

Referring to FIG. 5A as another example, the hole 300h may include a plurality of holes 300h arranged along one side edge of the cushion plate 300.

The plurality of holes 300h may be discontinuously arranged along on one side edge of the cushion plate 300.

Figure 5B:
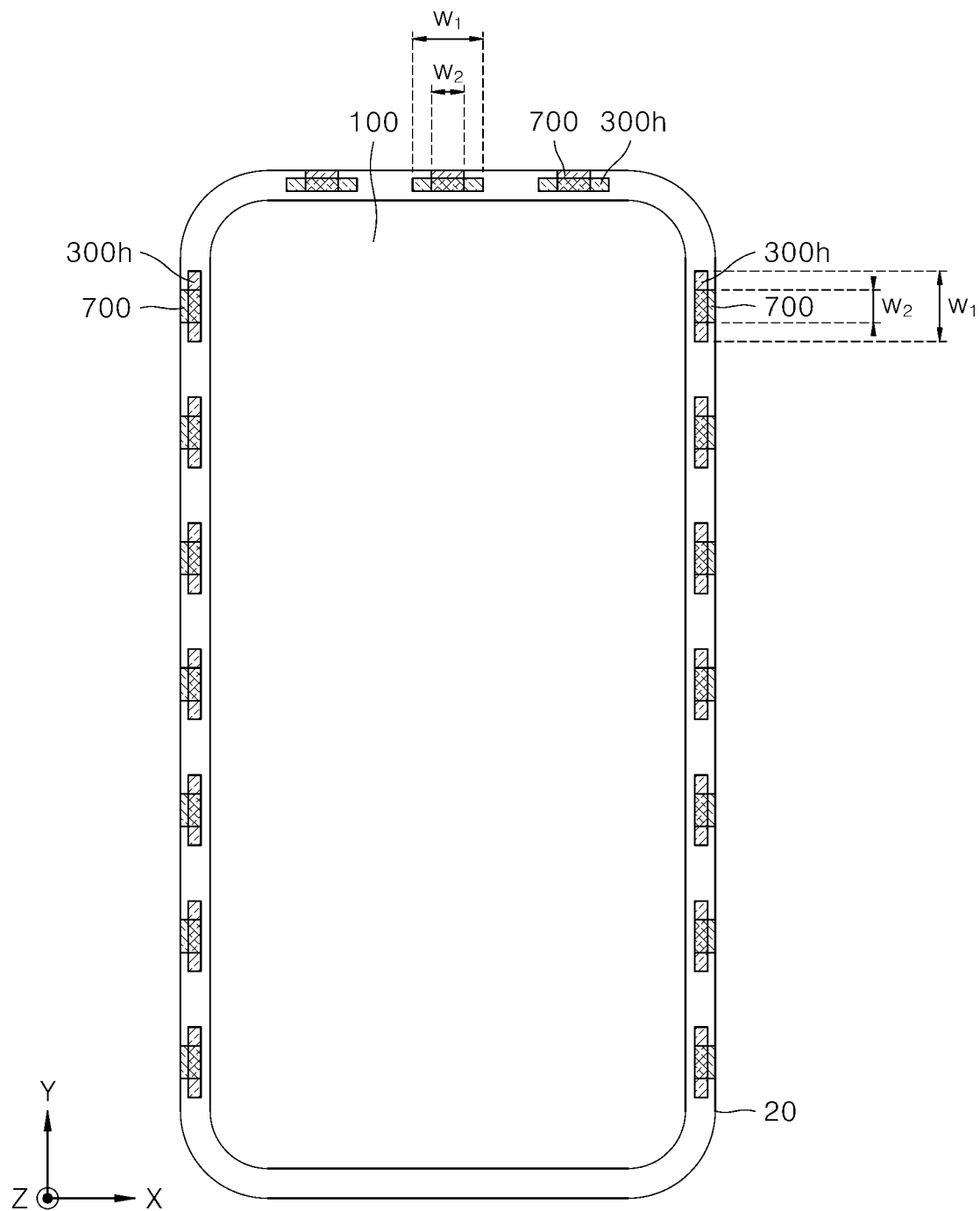

Further, referring to FIG. 5B, the hole 300h may include a plurality of holes 300h which may be discontinuously arranged along each of at least one side edge of the cushion plate 300, for example, three side edges except for one side edge at which the flexible circuit board 500 is disposed.

In one example, the display device 10 may include an anti-static layer 700 that electrically connects the cover member 20 and the cushion plate 300 to each other.

The anti-static layer 700 may electrically connect the cover member 20 to the heat-dissipation layer 310 as the conductive layer of the cushion plate 300.

Accordingly, the electric charged generated on the cover member 20 may migrate and may be dispersed along the anti-static layer 700.

Further, when the anti-static layer 700 is electrically connected to a ground through a ground path, the electric charges of the cover member 20 may be discharged to the outside through the ground.

The anti-static layer 700 may be formed by applying an anti-static solution in an anti-static (AS) coating scheme. A scheme of forming the anti-static layer 700 is not limited thereto. A type of the anti-static solution is not limited to a specific type.

The anti-static layer 700 may extend from the cover member 20 along a side surface of the display panel 100 to the hole 300h of the cushion plate 300.

The hole 300h of the cushion plate 300 may act as a boundary of the anti-static layer 700.

Therefore, the anti-static layer 700 extending from the cover member 20 may extend to the hole 300h of the cushion plate 300, but may not extend beyond the hole 300h.

The anti-static layer 700 may extend along and on the back surface of the cover member 20, the side surface of the display panel 100, a side surface of the cushion plate 300, and an inner surface defining the hole 300h.

Accordingly, the anti-static layer 700 may extend along and on at least a portion of the inner surface defining the hole 300h.

Referring to FIG. 3A and FIG. 3B, the anti-static layer 700 may extend continuously along and on the inner surface defining the hole 300h.

Accordingly, the anti-static layer 700 may continuously extend from the back surface of the cover member 20 to the inner surface defining the hole 300h.

Hereinafter, a process of forming the hole 300h of the cushion plate 300 and the anti-static layer 700 will be described.

For example, FIG. 6A to FIG. 6F show a process diagram of the aspect according to FIG. 3B.

Figure 6A:
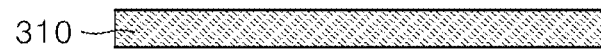
FIG. 6A to FIG. 6F are a process diagram of a process of manufacturing a cushion plate and a process diagram of attaching the cushion plate to a display device according to an aspect of the present disclosure.

Referring to FIG. 6A, a raw material of the heat-dissipation layer 310 may be prepared.

In one example, the raw material of the heat-dissipation layer 310 may include a SUS plate which may be punched using a die.

Figure 6B:

Referring to FIG. 6B, first processing may be performed on the prepared raw material of the heat-dissipation layer 310.

The first processing is performed for forming a first processing result 311, and may include forging the heat-dissipation layer 310 so that the heat-dissipation layer 310 has a predetermined pattern.

When the first processing is done, a pattern having a reduced thickness in an area corresponding to the hole 300h may be formed in the heat-dissipation layer 310.

Figure 6C:
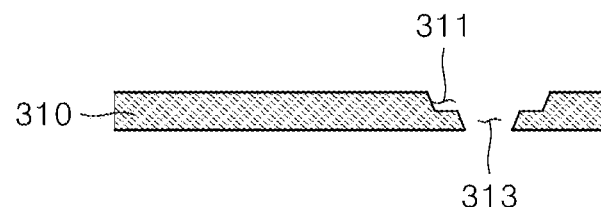

Referring to FIG. 6C, second processing may be performed on the first processing result 311 to form a size and a pattern of a target final hole 300h. The second processing is performed to form a second processing result 313, and may include punching the first processing result 311 based on a shape of the final hole 300h such that a punched hole may extend through the first processing result 311.

A size of the second processing result 313 may be smaller than a size of the first processing result 311 during the second processing, such that the heat-dissipation layer 310 may be formed in a stepped manner such that a diameter of the hole increases as the hole extends upwardly.

Figure 6D:
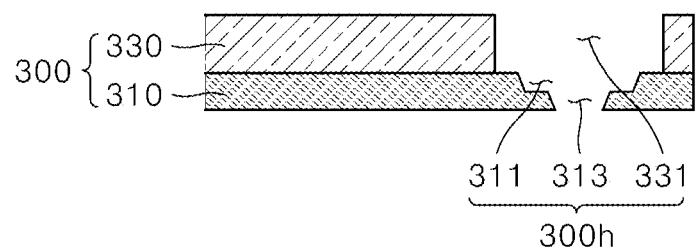

Referring to FIG. 6D, the cushion layer 330 having a through-hole 331 formed in the area corresponding to the hole 300h may be disposed on and coupled to one surface of the heat-dissipation layer 310.

Alternatively, the cushion layer 330 may be placed on one surface of the heat-dissipation layer 310, and then the through-hole 331 may be formed in the area corresponding to the hole 300h of the cushion layer 330.

The cushion layer 330 may be disposed on a top surface of the heat-dissipation layer 310 in which the first processing result 311 is formed.

The through-hole 331 of the cushion layer 330 may be larger than each of the first processing result 311 and the second processing result 313 of the heat-dissipation layer 310.

Therefore, a diameter of the through-hole 331 of the cushion layer 330 may be larger than a diameter of each of the first processing result 311 and the second processing result 313 of the heat-dissipation layer 310.

Figure 6E:
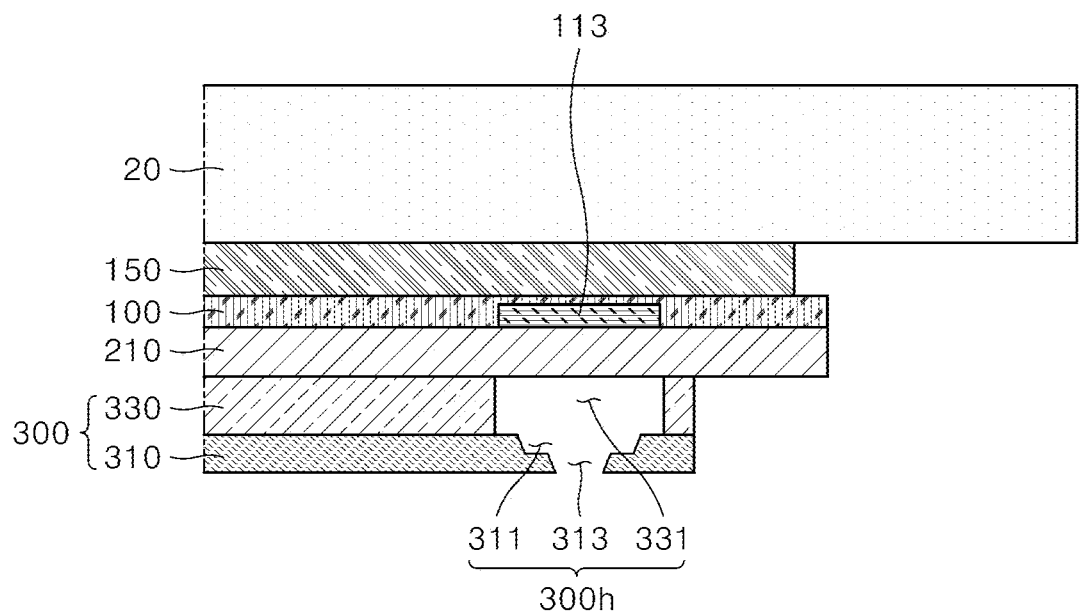

Referring to FIG. 6E, the cushion plate 300 including the cushion layer 330 and the heat-dissipation layer 310 as processed above may be placed on the back surface of the display panel 100 disposed on the back surface of the cover member 20.

Figure 6F:
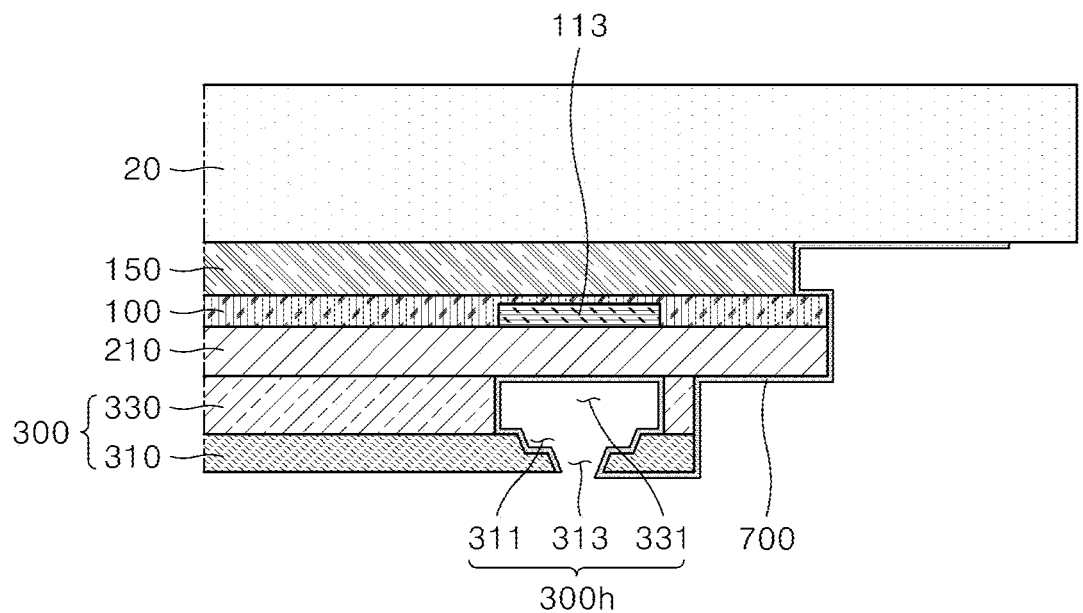

Referring to FIG. 6F, the anti-static layer 700 extending from the back surface of the cover member 20 to the inner surface of the hole 300h of the cushion plate 300 may be formed.

The anti-static layer 700 may be formed by coating the anti-static solution in a manner of applying the anti-static solution.

FIG. 7A to FIG. 7G show another process diagram of the aspect according to FIG. 3B.

Figure 7A:
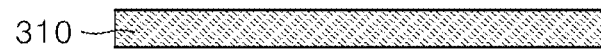
FIG. 7A to FIG. 7G are a process diagram of a process of manufacturing a cushion plate and a process diagram of attaching the cushion plate to a display device according to the aspect of the present disclosure.

Referring to FIG. 7A, a raw material of the heat-dissipation layer 310 may be prepared.

In one example, the raw material of the heat-dissipation layer 310 may include a SUS plate which may be punched using a die.

Figure 7B:

Referring to FIG. 7B, first processing may be performed on the prepared raw material of the heat-dissipation layer 310.

The first processing is performed for forming a first processing result 311, and may include forging the heat-dissipation layer 310 so that the heat-dissipation layer 310 has a predetermined pattern.

When the first processing is done, a pattern having a reduced thickness in an area corresponding to the hole 300h may be formed in the heat-dissipation layer 310.

Figure 7C:
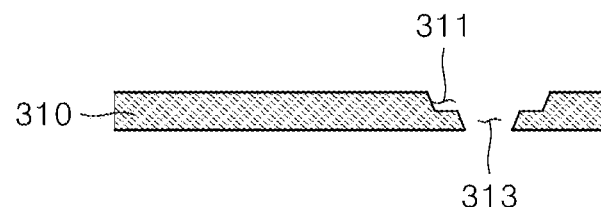

Referring to FIG. 7C, second processing may be performed on the first processing result 311 to form a size and a pattern of a target final hole 300h.

The second processing is performed to form a second processing result 313, and may include punching the first processing result 311 based on a shape of the final hole 300h such that a punched hole may extend through the first processing result 311.

A size of the second processing result 313 may be smaller than a size of the first processing result 311 during the second processing, such that the heat-dissipation layer 310 may be formed in a stepped manner such that a diameter of the hole increases as the hole extends upwardly.

Figure 7D:
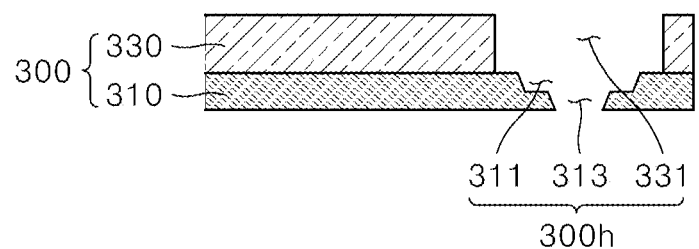

Referring to FIG. 7D, the cushion layer 330 having the through-hole 331 formed in the area corresponding to the hole 300h may be disposed on and coupled to one surface of the heat-dissipation layer 310.

Alternatively, the cushion layer 330 may be placed on one surface of the heat-dissipation layer 310, and then the through-hole 331 may be formed in the area corresponding to the hole 300h of the cushion layer 330.

The cushion layer 330 may be disposed on a top surface of the heat-dissipation layer 310 in which the first processing result 311 is formed.

The through-hole 331 of the cushion layer 330 may be larger than each of the first processing result 311 and the second processing result 313 of the heat-dissipation layer 310.

Therefore, a diameter of the through-hole 331 of the cushion layer 330 may be larger than a diameter of each of the first processing result 311 and the second processing result 313 of the heat-dissipation layer 310.

Figure 7E:
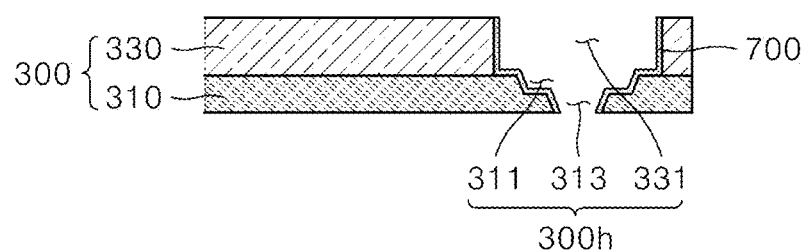

Referring to FIG. 7E, the anti-static layer 700 may be first formed on the inner surface of the hole 300h formed in the cushion plate 300.

In this case, the anti-static layer 700 may be formed continuously and evenly on the inner surface of the hole 300h by applying the anti-static solution in a direction from the cushion layer 330 in which a larger hole is formed toward the heat-dissipation layer 310 in which a smaller hole is formed.

The hole 300h has a step shape in which the diameter of the hole defined in the heat-dissipation layer 310 is smaller than the diameter of the hole defied in the cushion layer 330. Thus, when the anti-static solution is applied in a direction from the heat-dissipation layer 310 toward the cushion layer 330, it may be difficult to form the anti-static layer 700 so as to continuously extend on and along the inner surface of the hole 300h.

Therefore, before attaching the cushion plate 300 having the hole 300h defined therein to the back surface of the display panel 100, the anti-static solution may be applied in a direction from the cushion layer 330 in which a larger hole is formed toward the heat-dissipation layer 310 in which a smaller hole is formed, such that the anti-static layer 700 evenly and continuously extends along and on the inner surface of the hole 300h.

Figure 7F:
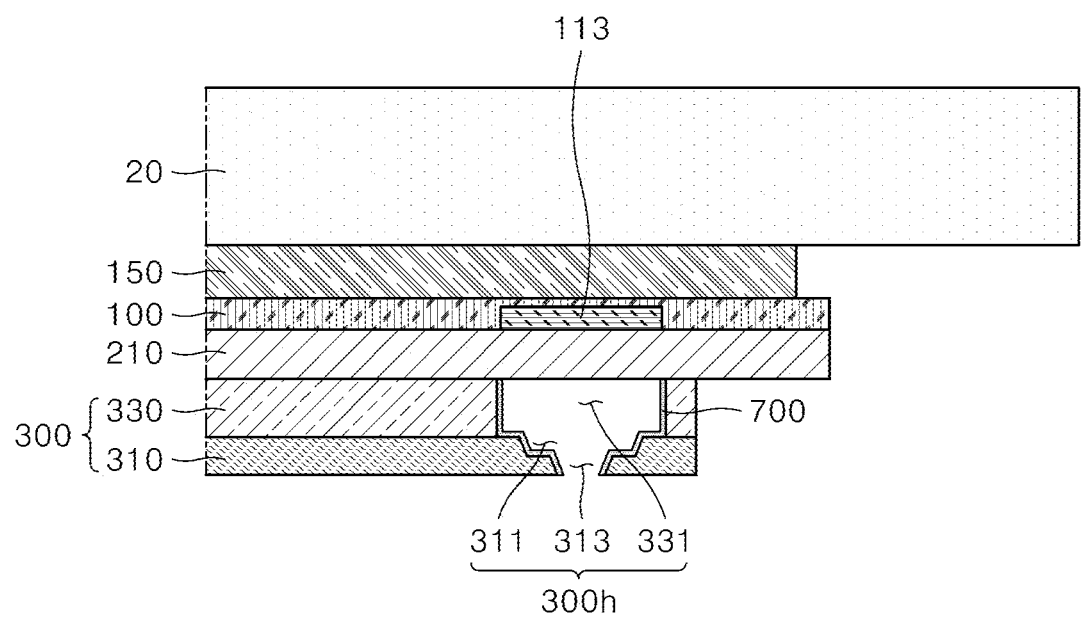

Referring to FIG. 7F, the cushion plate 300 including the cushion layer 330 and the heat-dissipation layer 310 as processed may be placed on the back surface of the display panel 100 disposed on the back surface of the cover member 20.

Figure 7G:
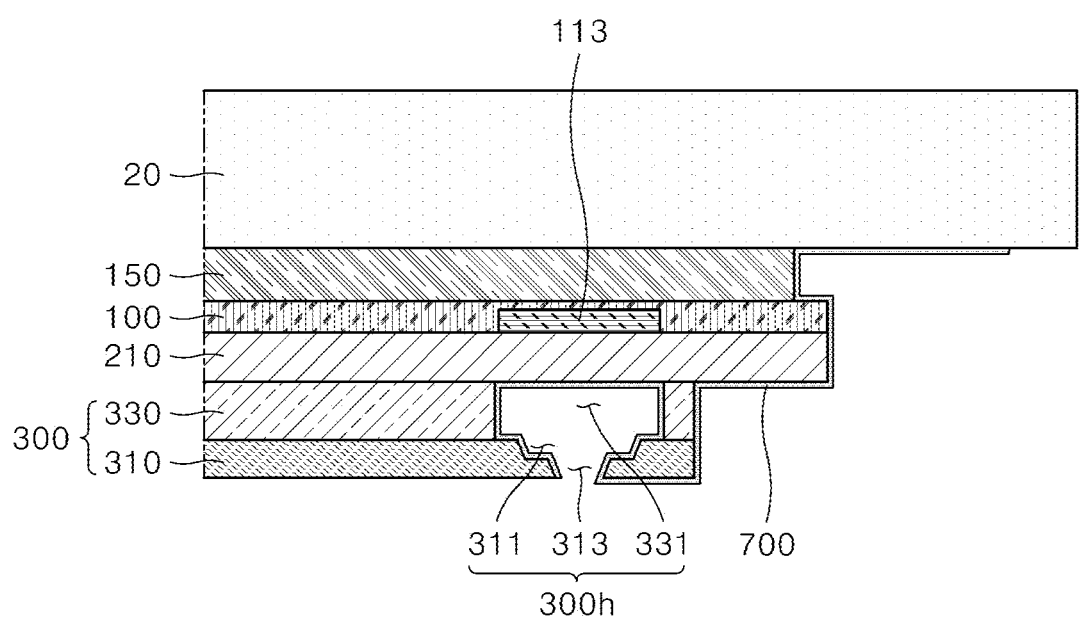

Referring to FIG. 7G, the anti-static layer 700 extending from the back surface of the cover member 20 to the inner surface of the hole 300*h* of the cushion plate 300 may be formed via second application of the anti-static solution.

The anti-static layer 700 may be formed by coating the anti-static solution in a manner of applying the anti-static solution.

The anti-static layer 700 has been previously formed on the inner surface of the hole 300*h* via the first application of the anti-static solution. Thus, even when the anti-static layer 700 is formed via the second application of the anti-static solution in the direction from the heat-dissipation layer 310 having the hole of a smaller diameter toward the cushion layer 330 having the hole of a larger diameter, the anti-static layer 700 which may extend continuously from the cover member 20 to the inner surface of the hole 300*h* may be formed.

Further, the anti-static layer 700 has been previously formed on the inner surface of the hole 300*h* via the first application of the anti-static solution. Thus, when additionally forming the anti-static layer 700 via the second application of the anti-static solution, a portion of the anti-static layer 700 on the inner surface of the hole 300*h* may be thicker than a portion of the anti-static layer 700 formed out of the hole 300*h*.

However, since the thickness of the anti-static layer 700 formed in an inner space defined by the inner surface of the hole 300*h* becomes larger. This may not affect a design tolerance with other components out of the hole 300*h*.

Further, referring to FIG. 3C, the anti-static layer 700 may discontinuously extend along and on the inner surface of the hole 300*h*.

The anti-static layer 700 may extend discontinuously on and along an entire area of the inner surface of the hole 300*h*.

In one example, referring to FIG. 4A, FIG. 4B and FIG. 5A, FIG. 5B, a width W1 of the hole 300*h* of the cushion plate 300 may be greater than or equal to a width W2 of the anti-static layer 700 corresponding to the hole 300*h*.

Each of the width W1 of the hole 300*h* and the width W2 of the anti-static layer 700 may be a dimension of a length of each of the hole 300*h* and the anti-static layer 700 extending along one side edge of the cushion plate 300.

Accordingly, the hole 300*h* may act as a boundary of the anti-static layer 700, that is, as a distal end thereof. Thus, a portion of the anti-static layer 700 corresponding to the hole 300*h* may be formed so as not to exceed the boundary thereof formed by the hole 300*h*.

The display device and the display apparatus according to the aspects of the present disclosure as described above may have following advantageous effects.

According to the aspect of the present disclosure, the anti-static layer 700 extends from the cover member 20 along the side surface of the display panel 100 to the inner surface of the hole 300*h* of the cushion plate 300, such that an area in which the anti-static layer 700 is in contact with the display panel 100 increases.

Figure 8A:
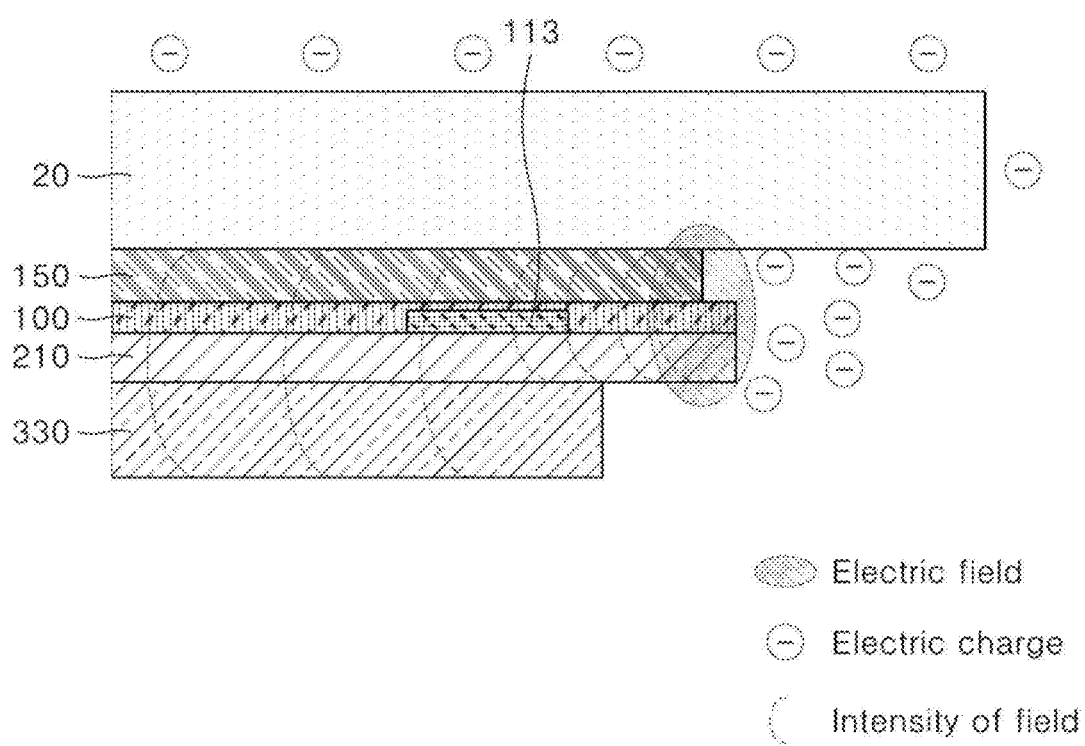
FIG. 8A to FIG. 8C show various aspects in which an anti-static layer according to an aspect of the present disclosure is formed and show an intensity of an electric field.

Referring to FIG. 8A, when a separate anti-static layer is not formed on the side surface of the display panel 100 and thus the electric charges generated on the surface of the display apparatus 1 are not effectively discharged to the outside, the electric charges may be intensively accumulated on the side surface of the distal end of the display panel 100.

When the electric charges are intensively accumulated on the side area of the distal end of the display panel 100, a strong electric field may be generated in the side area of the display panel 100.

Figure 9:
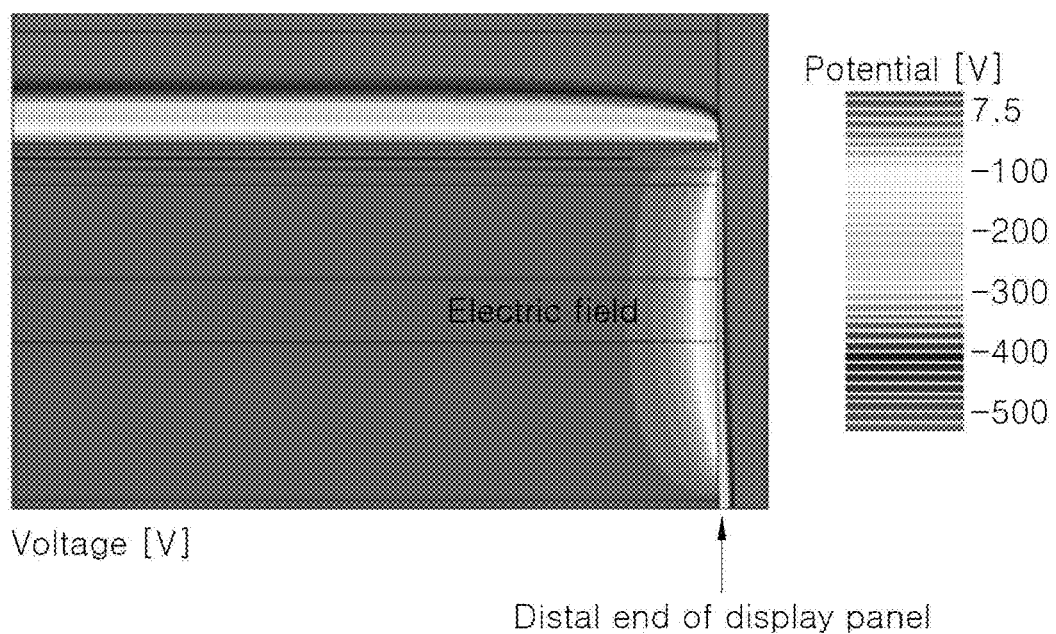
FIG. 9 shows a measurement of potential voltage at a distal end of a display panel.

Accordingly, as shown in FIG. 9, a brighter phenomenon in which the side area of the distal end of the display panel becomes brighter compared to the display area AA of the display panel 100, and a greenish phenomenon in which a partial area thereof emits green color may occur.

When the brighter phenomenon and the greenish phenomenon occur at the distal end of the display panel 100, this may lead to a quality defect of the display panel 100.

Figure 8B:
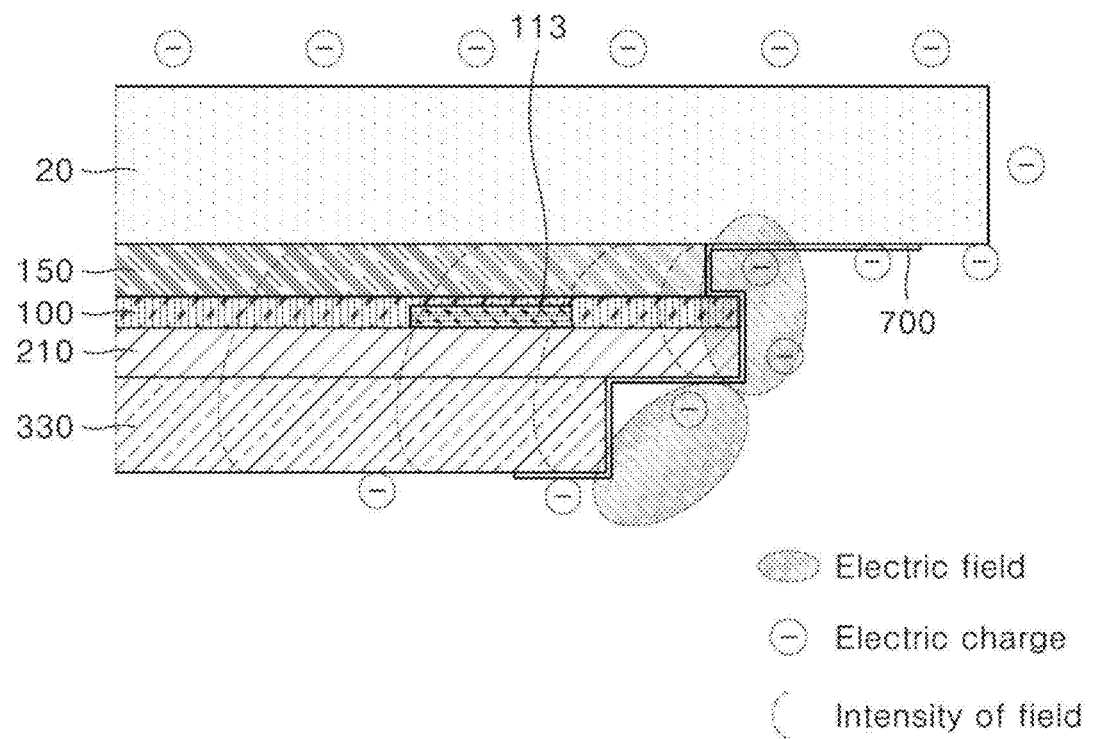

Referring to FIG. 8B, the anti-static layer 700 may be formed to extend from the back surface of the cover member 20 to the cushion plate 300.

As the anti-static layer 700 is formed, the electric charged generated on the surface of the cover member 20 are not concentrated only on the side surface of the display panel 100, but are distributed to the cushion plate 300 along the side surface of the display panel 100 through the anti-static layer 700.

As such, as the electric charges are not accumulated only on the side surface of the display panel 100 but are dispersed through the anti-static layer 700, the area in which the electric field is generated may be expanded.

When the electric field generating area is expanded, an intensity of the electric field in the electric field generating area may be reduced.

Figure 8C:
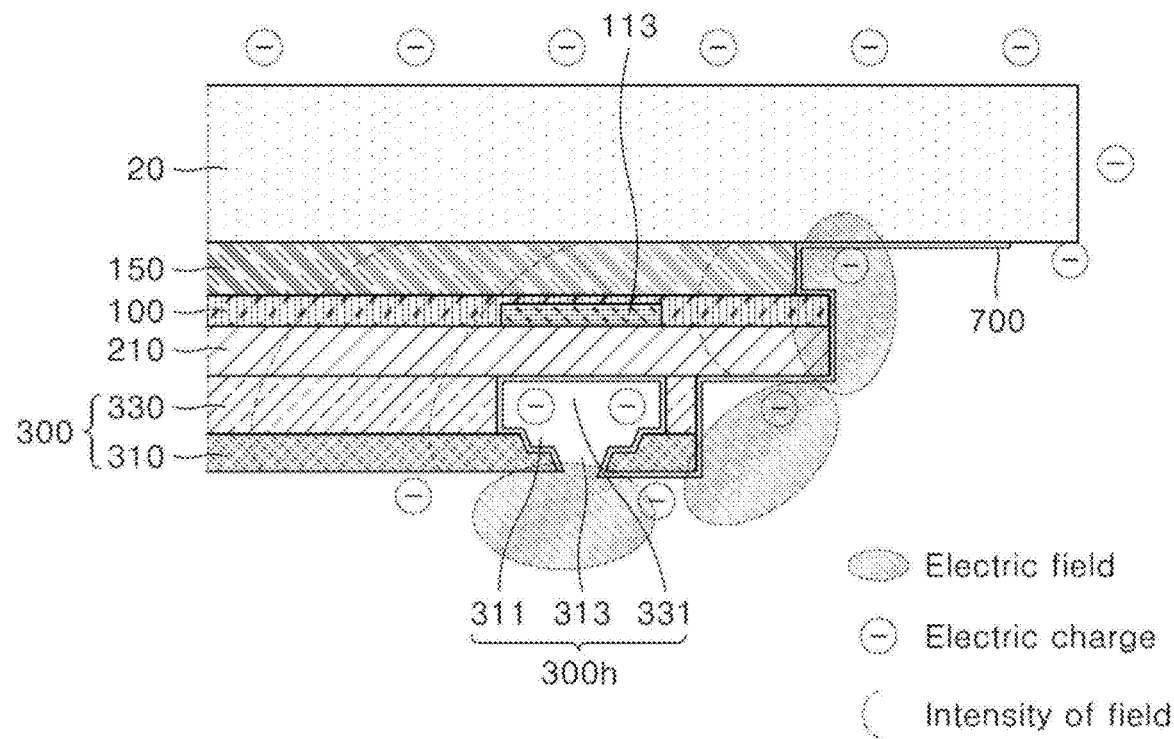

On the other hand, referring to FIG. 8C, when the hole 300*h* is formed in the cushion plate 300, and the anti-static layer 700 extends from the cover member 20 along the side surface of the display panel 100 to the inner surface of the hole 300*h* of the cushion plate 300, the area in which the anti-static layer 700 is in contact with display panel 100 may be further increased.

Since the anti-static layer 700 may be formed on at least a portion of the inner surface of the hole 300*h*, the inner area of the hole 300*h* may act as an extended area of the anti-static layer 700.

Therefore, the electric charged generated on the surface of the cover member 20 are not intensively accumulated only on the side surface of the display panel 100, but the electric charges are further dispersed to the anti-static layer 700 formed on the inner surface of the hole 300*h* of the cushion plate 300, such that the electric field generating area may be further expanded.

In this way, the electric field generating area may not be concentrated only on the side surface of the display panel 100, but may be expanded toward other areas, so that the strong concentration of the electric field only on the specific area may be reduced, and the electric field generated in the expanded electric field generating area may be relatively weak.

Accordingly, according to the aspect of the present disclosure, the brighter phenomenon and the greenish phenomenon that may be intensively generated in the partial area of the side surface of the display panel 100 may be reduced.

Further, the hole 300*h* of the cushion plate 300 may act as a boundary where the anti-static layer 700 is terminated, and the anti-static layer 700 may also be formed on the inner surface of the hole 300*h*. Thus, the formation area and the thickness of the anti-static layer 700 may be easily controlled as required by the user.

The hole 300*h* extending through at least a partial area of the cushion plate 300 may be formed such that the hole 300*h* may function as a boundary at which the anti-static layer 700 is terminated.

The anti-static layer 700 may be formed by applying an anti-static solution. Since the anti-static solution has a low viscosity, it is very difficult to control an application width or thickness thereof.

Additional components such as a frame or a casing may be attached to the back surface of the display device 10 on which the anti-static layer 700 has been formed.

When these additional components are attached thereto, a position, a width, a thickness, etc. of each of the components may be set based on design requirements in order to minimize interference of each of the components.

However, when the anti-static layer 700 may be formed by applying the anti-static solution, it may be difficult to control the application width or thickness thereof. Thus, when the width or thickness thereof is larger than the design requirement, problems such as high-frequency noise (RF noise) may occur in an assembly process of the display apparatus.

Therefore, according to an aspect of the present disclosure, the hole 300*h* is formed in the edge portion of the cushion plate 300, such that the hole 300*h* may act as the boundary where the anti-static layer 700 is terminated. Thus, when the anti-static layer 700 is formed by applying the anti-static solution, the application boundary may be clearly set.

Further, the hole 300*h* is formed to extend through at least partial an area of the cushion plate 300, such that the anti-static solution may stay in the hole 300*h*.

Accordingly, even when the anti-static layer 700 has a thickness larger than the design requirement in the area corresponding to the hole 300*h*, it may be easy to manage the application thickness of the anti-static layer 700 which may be formed on the inner surface of the hole 300*h*.

According to one aspect of the present disclosure, a diameter of the open lower portion 303*h* of the hole 300*h* may increase as the hole extends upwardly toward the blocked upper portion 301*h*.

The open lower portion 303*h* of the hole 300*h* is formed to have a diameter smaller than that of the blocked upper portion 301*h* of the hole 300*h*. Thus, the hole 300*h* may easily disconnect the anti-static layer 700.

Further, according to one aspect of the present disclosure, the open lower portion 303*h* of the hole 300*h* may be formed in a step shape in which the diameter thereof increases as it extends toward the blocked upper portion 301*h*. Thus, the hole 300*h* including the step-shaped open lower portion 303*h* may easily disconnect the anti-static layer 700.

In this way, the hole 300*h* may function to disconnect the anti-static layer 700. Thus, a length by which the anti-static layer 700 is to be applied may be calculated in advance, and then the hole 300*h* may be formed at a position corresponding to a boundary of the length. Thus, the length of the anti-static layer 700 may be easily set to meet the design requirement.

Further, according to an aspect of the present disclosure, the heat-dissipation layer including the metal may constitute the outermost portion of the cushion plate 300, thereby effectively protect the distal end area of the display panel 100 which is vulnerable to cracks.

For example, when the heat-dissipation layer including the metal constituting the outermost portion of the cushion plate 300 is made of a SUS plate having a small thickness and very high strength, the distal end area of the display panel 100 may be more effectively protected.

A first aspect of the present disclosure provides a display device comprising: a cover member; a display panel disposed on a back surface of the cover member; a cushion plate disposed on a back surface of the display panel, wherein the cushion plate has at least one hole disposed in an edge portion thereof; and an anti-static layer formed to electrically connect the cover member and the cushion plate to each other.

In one implementation of the first aspect, the anti-static layer extends along and on a back surface of the cover member, a side surface of the display panel, a side surface of the cushion plate, and an inner surface of the hole.

In one implementation of the first aspect, the anti-static layer extends continuously on and along the inner surface of the hole.

In one implementation of the first aspect, the anti-static layer extends discontinuously on and along the inner surface of the hole.

In one implementation of the first aspect, the hole is composed of a blocked upper portion and an open lower portion below the blocked upper portion, wherein a diameter of the open lower portion is equal to a diameter of the blocked upper portion.

In one implementation of the first aspect, the hole is composed of a blocked upper portion and an open lower portion below the blocked upper portion, wherein a diameter of the open lower portion is smaller than a diameter of the blocked upper portion.

In one implementation of the first aspect, the open lower portion has a step shape formed such that a diameter of the open lower portion increases as the hole extends upwardly toward the blocked upper portion.

In one implementation of the first aspect, the display panel includes a display area and a non-display area surrounding the display area, wherein the hole is disposed to vertically overlap the non-display area.

In one implementation of the first aspect, the hole is disposed along at least one side edge of the cushion plate, wherein the hole includes a plurality of the holes arranged along one side edge of the cushion plate.

In one implementation of the first aspect, the hole is disposed along at least one side edge of the cushion plate, wherein the hole is disposed in a shape of a line extending along one side edge of the cushion plate.

In one implementation of the first aspect, a dimension of the hole extending in an extension direction of a side edge of the cushion plate is larger than or equal to a dimension of the anti-static layer extending in the extension direction of the side edge of the cushion plate.

A second aspect of the present disclosure provides a display device comprising: a cover member; a display panel disposed on a back surface of the cover member; a cushion plate disposed on a back surface of the display panel, wherein the cushion plate has at least one hole; and an anti-static layer extending from the cover member along a side surface of the display panel to an inner surface of the hole of the cushion plate.

In one implementation of the second aspect, the cushion plate includes a cushion layer and a heat-dissipation layer disposed on a back surface of the cushion layer, wherein the hole vertically extends through the cushion layer and the heat-dissipation layer.

In one implementation of the second aspect, the anti-static layer electrically connects the cover member and the heat-dissipation layer of the cushion plate to each other.

In one implementation of the second aspect, a diameter of a portion of the hole in the heat-dissipation layer is smaller than a diameter of a portion of the hole in the cushion layer.

In one implementation of the second aspect, a portion of the hole in the heat-dissipation layer has a step shape formed such that a diameter of the portion increases as the portion vertically extends toward the cushion layer.

In one implementation of the second aspect, the anti-static layer is disposed on at least a portion of the inner surface of the hole.

In one implementation of the second aspect, the display panel includes a GIP (Gate in panel) driver disposed in a non-display area of the display panel, wherein the hole is disposed to vertically overlap the GIP driver.

In one implementation of the first aspect or the second aspect, a portion of the anti-static layer on an inner surface of the hole is thicker than a portion of the anti-static layer formed out of the hole.

A third aspect of the present disclosure provides a display apparatus comprising: the display device as defined above, and a casing disposed on a back surface of the display device so as to support the cover member.

Although the aspects of the present disclosure have been described above in more detail with reference to the accompanying drawings, the present disclosure is not necessarily limited to the aspects, and various modifications may be made within the scope that does not deviate from the technical spirit of the present disclosure. Therefore, the aspects as disclosed in the present disclosure are to illustrate the disclosure rather than limiting the technical idea of the present disclosure, and the scope of the technical idea of the present disclosure is not limited to the aspects. Therefore, it should be understood that the aspects as described above are illustrative in all respects and not restrictive. The protective scope of the present disclosure should be interpreted based on the claims, and all technical ideas within the scope equivalent thereto should be construed as being included in the scope of the present disclosure.

What is claimed is:

1. A display device comprising:
    a cover member;
    a display panel disposed under the cover member;
    a cushion plate disposed under the display panel and having at least one hole disposed in an edge portion thereof; and
    an anti-static layer disposed to electrically connect the cover member and the cushion plate,
    wherein the anti-static layer extends along and on a back surface of the cover member, a side surface of the display panel, a side surface of the cushion plate, and an inner surface of the at least one hole, and
    wherein the anti-static layer extends continuously on and along the inner surface of the at least one hole.

2. The display device of claim 1, wherein the anti-static layer extends discontinuously on and along the inner surface of the at least one hole.

3. The display device of claim 1, wherein the at least one hole includes a blocked upper portion and an open lower portion below the blocked upper portion, and
    wherein a diameter of the open lower portion is equal to a diameter of the blocked upper portion.

4. The display device of claim 1, wherein the at least one hole includes a blocked upper portion and an open lower portion below the blocked upper portion, and
    wherein a diameter of the open lower portion is smaller than a diameter of the blocked upper portion.

5. The display device of claim 4, wherein the open lower portion has a step shape formed such that a diameter of the open lower portion increases as the hole extends upwardly toward the blocked upper portion.

6. The display device of claim 1, wherein the display panel includes a display area and a non-display area surrounding the display area, and
    wherein the hole is disposed to vertically overlap with the non-display area.

7. The display device of claim 1, wherein the at least one hole is disposed along at least one side edge of the cushion plate,
    wherein the at least one hole includes a plurality of the holes arranged along one side edge of the cushion plate.

8. The display device of claim 1, wherein the at least one hole is disposed along at least one side edge of the cushion plate, and disposed in a shape of a line extending along one side edge of the cushion plate.

9. The display device of claim 1, wherein a dimension of the at least one hole extending in an extension direction of a side edge of the cushion plate is larger than or equal to a dimension of the anti-static layer extending in the extension direction of the side edge of the cushion plate.

10. A display device comprising:
    a cover member;
    a display panel disposed under the cover member;
    a cushion plate disposed under the display panel and having at least one hole; and
    an anti-static layer extending from the cover member along a side surface of the display panel to an inner surface of the at least one hole of the cushion plate,
    wherein the anti-static layer extends continuously on and along the inner surface of the at least one hole.

11. The display device of claim 10, wherein the cushion plate includes a cushion layer and a heat-dissipation layer disposed under the cushion layer,
    wherein the at least one hole vertically extends through the cushion layer and the heat-dissipation layer.

12. The display device of claim 11, wherein the anti-static layer electrically connects the cover member and the heat-dissipation layer of the cushion plate.

13. The display device of claim 11, wherein a diameter of a portion of the hole in the heat-dissipation layer is smaller than a diameter of a portion of the at least one hole in the cushion layer.

14. The display device of claim 11, wherein a portion of the at least one hole in the heat-dissipation layer has a step shape formed such that a diameter of the portion increases as the portion vertically extends toward the cushion layer.

15. The display device of claim 10, wherein the anti-static layer is disposed on at least a portion of the inner surface of the at least one hole.

16. The display device of claim 10, wherein the display panel includes a GIP (Gate in panel) driver disposed in a non-display area of the display panel, and
    wherein the at least one hole is disposed to vertically overlap with the GIP driver.

17. The display device of claim 10, wherein a portion of the anti-static layer on an inner surface of the hole is thicker than a portion of the anti-static layer formed out of the hole.

18. A display apparatus comprising:
    a display device;
    a casing disposed on a back surface of the display device and supporting a cover member,
    wherein the display device includes:
        the cover member;
        a display panel disposed under the cover member;
        a cushion plate disposed under the display panel and having at least one hole disposed in an edge portion thereof; and an anti-static layer disposed to electrically connect the cover member and the cushion plate, wherein the anti-static layer extends along and on a back surface of the cover member, a side surface of the display panel, a side surface of the cushion plate, and an inner surface of the at least one hole, and wherein the anti-static layer extends continuously on and along the inner surface of the at least one hole.

\* \* \* \* \*